(12) United States Patent
Tsukuda

(10) Patent No.: US 11,626,374 B1
(45) Date of Patent: Apr. 11, 2023

(54) SEMICONDUCTOR DEVICE

(71) Applicant: RENESAS ELECTRONICS CORPORATION, Tokyo (JP)

(72) Inventor: Tatsuaki Tsukuda, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 17/519,682

(22) Filed: Nov. 5, 2021

(51) Int. Cl.
 *H01L 23/00* (2006.01)
 *H01L 23/66* (2006.01)
 *H01L 23/498* (2006.01)

(52) U.S. Cl.
 CPC ........ *H01L 23/66* (2013.01); *H01L 23/49838* (2013.01); *H01L 23/49827* (2013.01); *H01L 24/06* (2013.01); *H01L 24/48* (2013.01); *H01L 2223/6616* (2013.01); *H01L 2223/6661* (2013.01); *H01L 2224/06134* (2013.01); *H01L 2224/06135* (2013.01); *H01L 2224/06154* (2013.01); *H01L 2224/48227* (2013.01)

(58) Field of Classification Search
 CPC ............... H01L 23/66; H01L 23/49838; H01L 23/49827; H01L 24/06; H01L 24/48; H01L 2223/6616; H01L 2223/6661; H01L 2224/06134; H01L 2224/06135; H01L 2224/06154; H01L 2224/48227
 See application file for complete search history.

(56) References Cited

U.S. PATENT DOCUMENTS 6,433,441 B1 8/2002 Niwa et al.
10,541,216 B2 1/2020 Nakagawa et al.

FOREIGN PATENT DOCUMENTS

JP 2001-024084 A 1/2001
JP 2019-114601 A 7/2019

*Primary Examiner* — Elias Ullah
(74) *Attorney, Agent, or Firm* — McDermott Will & Emery LLP

(57) ABSTRACT

A semiconductor device includes a wiring substrate including a first wiring layer. The first wiring layer includes a first wiring pattern which is a transmission path of a first signal, a second wiring pattern which is a transmission path of a second signal and which is arranged next to one side of the first wiring pattern, and a third wiring pattern which is a transmission path of a third signal and which is arranged next to the other side of the first wiring pattern. A wiring pattern group including the first through third wiring patterns has: a first portion in which wiring widths of the first through third wiring patterns are equal to each other; and a second portion in which the wiring width of the first wiring pattern is larger than the wiring width of each of the second and third wiring patterns.

11 Claims, 14 Drawing Sheets

SEMICONDUCTOR DEVICE

BACKGROUND

The present invention relates to a semiconductor device, and relates to, for example, a technology effectively applied to a semiconductor device using a wiring substrate on which a semiconductor chip and a wiring substrate are electrically connected to each other via bonding wires.

As a semiconductor device using a wiring substrate having a plurality of wiring layers, there are Patent Document 1 (Japanese Unexamined Patent Application Publication No. 2001-24084) and Patent Document 2 (Japanese Unexamined Patent Application Publication No. 2019-114601).

There are Disclosed Techniques Listed Below

[Patent Document 1] Japanese Unexamined Patent Application Publication No. 2001-24084
[Patent Document 2] Japanese Unexamined Patent Application Publication No. 2019-114601

SUMMARY

In recent years, there has been a demand for miniaturization and high signal transmission speed even for low-cost type semiconductor devices. As a low-cost type semiconductor device, for example, a semiconductor device in which a semiconductor chip and a wiring substrate are electrically connected to each other via bonding wires or a semiconductor device of a type in which a wiring substrate has two wiring layers can be presented.

It has been found that increasing the signal transmission speed in the low-cost type semiconductor device described above poses a problem from the viewpoint of ensuring communication quality.

Other problem and novel features will be apparent from the description of the present specification and accompanying drawings.

A semiconductor device according to an embodiment includes a semiconductor chip, a wiring substrate on which the semiconductor chip is mounted, and a bonding wire electrically connecting the semiconductor chip and the wiring substrate. The wiring substrate includes a first wiring layer in which a bonding pad is formed and a second wiring layer in which an external terminal is formed. The first wiring layer includes a first wiring pattern which is a transmission path of a first signal, a second wiring pattern which is a transmission path of a second signal, and which is arranged next to one side of the first wiring pattern, and a third wiring pattern which is a transmission path of a third signal and which is arranged next to the other side of the first wiring pattern. A wiring pattern group including the first wiring pattern, the second wiring pattern and the third wiring pattern has a first portion in which a wiring width of the first wiring pattern, a wiring width of the second wiring pattern and a wiring width of the third wiring pattern are equal to each other and a second portion in which the wiring width of the first wiring pattern is larger than the wiring width of the second wiring pattern and the wiring width of the third wiring pattern.

BRIEF DESCRIPTIONS OF THE DRAWINGS

DETAILED DESCRIPTION

Figure 1:
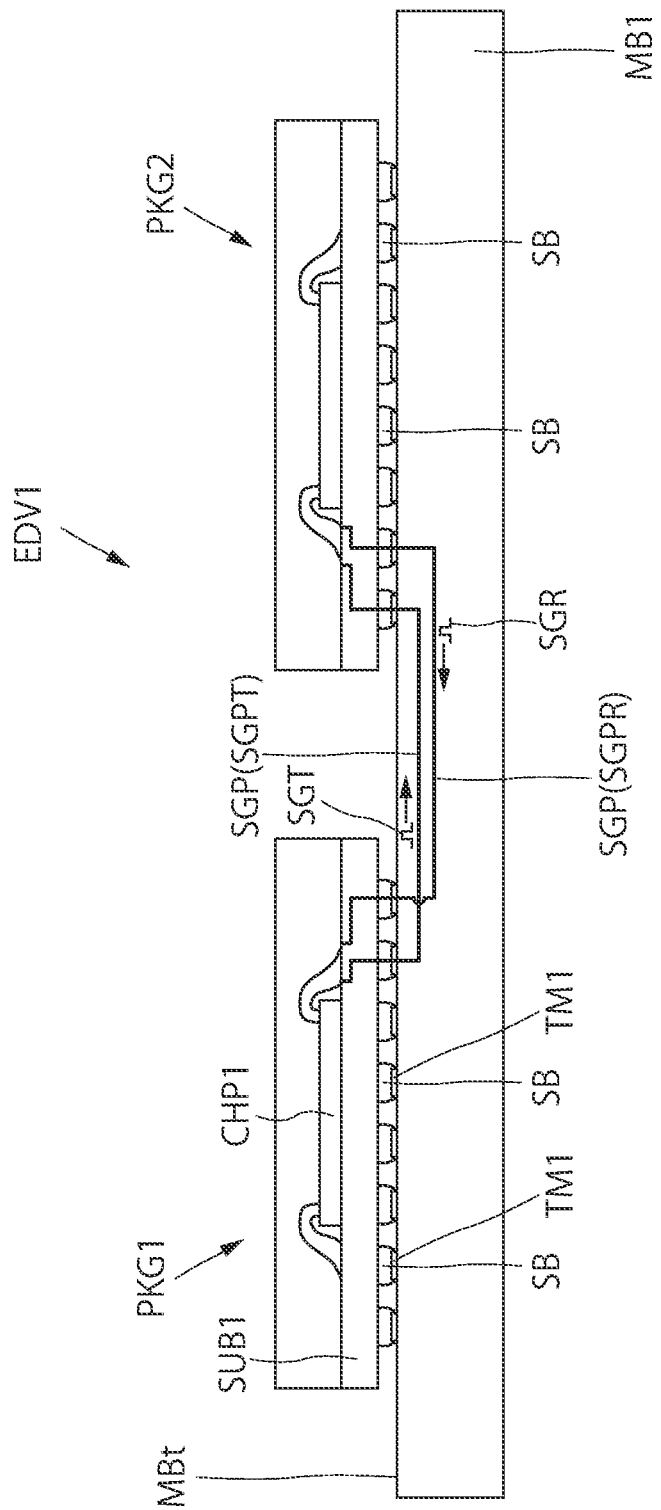
FIG. 1 is an explanatory diagram showing a configuration example of an electronic device including semiconductor devices according to an embodiment.

<Explanation of Description Form, Basic Terminology, and Usage in Present Application>

In the present application, the embodiments will be described in a plurality of sections or the like when required as a matter of convenience. However, these sections or the like are not irrelevant to each other unless otherwise stated, and a part of one example relates to the other example as details or a part or the entire of a modification regardless of the order of description. Also, the repetitive description of similar parts will be omitted in principle. Further, the constituent elements in the embodiments are not always indispensable unless otherwise stated or except for the case where the constituent elements are theoretically indispensable in principle or the constituent elements are obviously indispensable from the context.

Likewise, in the description of the embodiments, the phrase "X made of A" for a material, a composition or the like is not intended to exclude those containing elements other than A unless otherwise specified and except for the case where it clearly contains only A from the context. For example, as for a component, it means "X containing A as a main component". For example, a "silicon member" or the like is not limited to pure silicon and it is obvious that the silicon member includes a member made of silicon germanium (SiGe) alloy, a member made of multicomponent alloy containing silicon as a main component, and a member containing other additives or the like. In addition, when mentioning gold plating, a Cu layer, nickel plating or the like, it includes a member containing gold, Cu, nickel, or the like as a main component as well as a pure one unless otherwise specified clearly.

In addition, when referring to a specific value or amount, a value or amount larger or smaller than the specific value or amount is also applicable unless otherwise stated or except for the case where the value or amount is logically limited to the specific value or amount and the value or amount is apparently limited to the specific value or amount from the context. In the following description, even when it is described that a value and another value are the same or equal, the meaning of "same" or "equal" includes not only the case where the values are exactly the same or equal, but also the case where the values have some difference within the range in which they can be regarded as substantially same or equal.

Further, in the drawings for the embodiments, the same or similar parts are denoted by the same or similar reference characters or reference numbers, and the descriptions thereof are not repeated in principle.

In addition, in the accompanying drawings, hatching may be omitted even in cross-sections in the case where the hatchings make the drawings complicated on the contrary or discrimination from void is clear. In relation to this, when it is clear from the description or the like, an outline of a background may be omitted even in a planarly closed hole. Furthermore, even in the cases other than the cross-section, hatching or dot pattern may be applied so as to clarify that a portion is not a vacant space or clearly illustrate the boundary between regions.

In the following description, among conductor patterns formed on a wiring substrate, a conductor pattern to which a power supply potential is supplied is described as a power supply pattern. Also, among conductor patterns formed on a wiring substrate, a conductor pattern to which a reference potential is supplied is described as a ground pattern. Further, among conductor patterns, a pattern to which a reference potential is supplied and which is extended linearly is described as a ground wiring pattern.

<Electronic Device>

Figure 2:
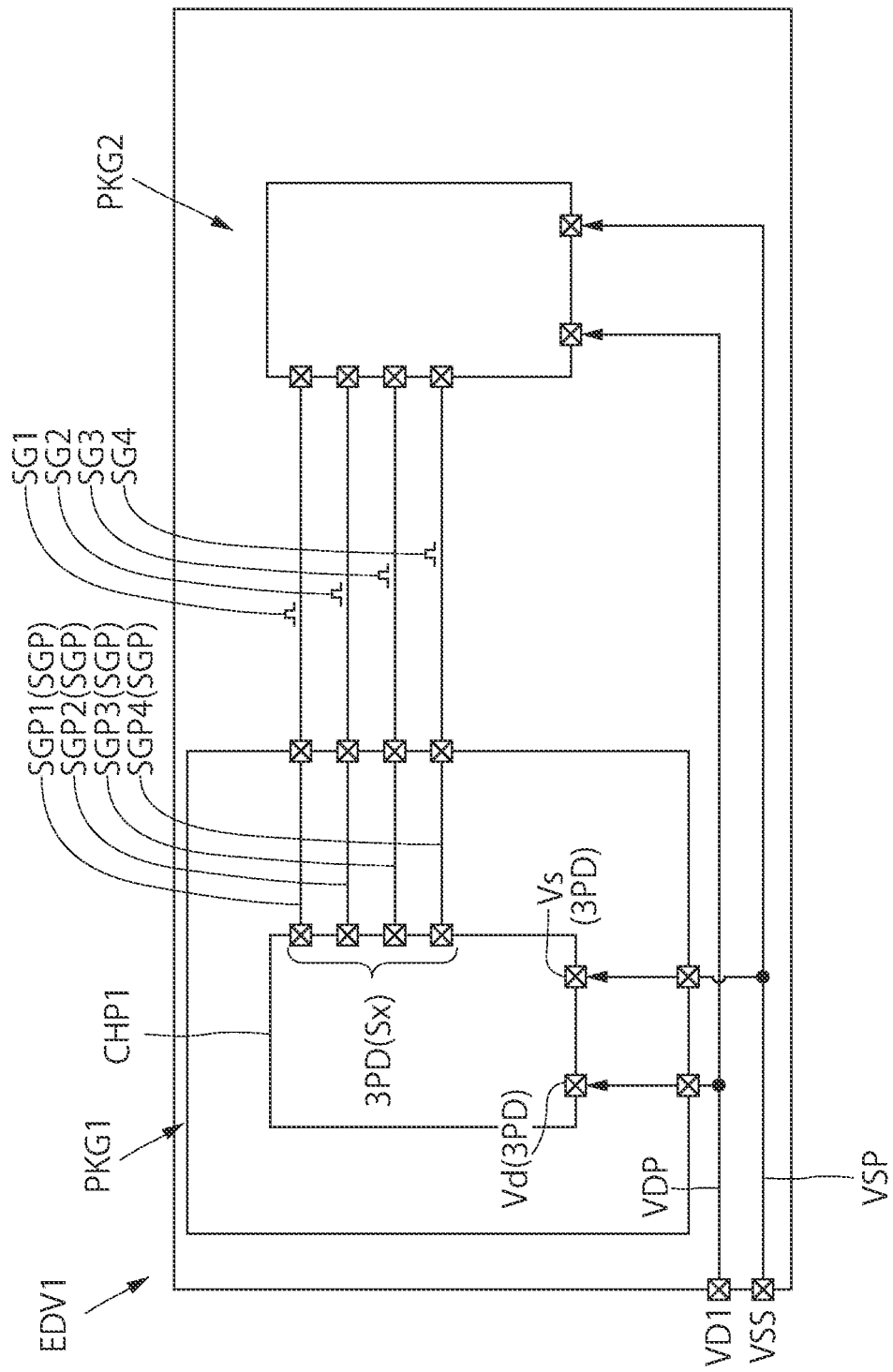
FIG. 2 is an explanatory diagram showing a configuration example of a circuit in the electronic device shown in FIG. 1.

First, an example of using the semiconductor device according to the present embodiment described below will be described with reference to FIG. 1 and FIG. 2. FIG. 1 is an explanatory diagram showing a configuration example of an electronic device including the semiconductor device according to the present embodiment. Also, FIG. 2 is an explanatory diagram showing a configuration example of a circuit included in the electronic device shown in FIG. 1. In FIG. 1, in order to clearly show that a semiconductor device PKG1 and a semiconductor device PKG2 are electrically connected, signal transmission paths SGP shown in FIG. 2 are schematically shown by thick lines.

The electronic device (electronic equipment) EDV1 shown in FIG. 1 a includes a wiring substrate (motherboard, mounting board) MB1 and the semiconductor device PKG1 and the semiconductor device PKG2 mounted on the wiring substrate MB1. The semiconductor device PKG1 and the semiconductor device PKG2 are electrically connected to each other via the signal transmission paths SGP formed in the wiring substrate MB1. The signals transmitted via the signal transmission paths SGP include a signal SGT output from the semiconductor device PKG1 and a signal SGR input to the semiconductor device PKG1. Also, the signal transmission paths SGP include a signal transmission path SGPT which the signal SGT is transmitted and a signal transmission path SGPR in which the signal SCR is transmitted.

In the example shown in FIG. 1, the signal SGT is output from the semiconductor device PKG1 and input to the semiconductor device PKG2. Also, the signal SGR is output from the semiconductor device PKG2 and input to the semiconductor device PKG1. However, the output destination of the signal SGT and the output source of the signal SGR are not limited to the examples shown in FIG. 1, and there are various modifications. Since the semiconductor device PKG1 and the semiconductor device PKG2 shown in FIG. 1 have the same structure, the semiconductor device PKG1 will be described as a representative below.

As shown in FIG. 2, the electronic device EDV1 has a plurality of signal transmission paths SGP. Each of the plurality of signal transmission paths SGP is a high-speed transmission path (high-speed signal transmission path) in which a signal (for example, a data signal) is transmitted at a transmission speed of, for example, 1.6 Gbps (Gigabit per second). The plurality of signal transmission paths SGP includes a signal transmission path SGP1 in which a signal SG1 is transmitted. The plurality of signal transmission paths SGP includes a signal transmission path SGP2 in which a signal SG2 is transmitted. The plurality of signal transmission paths SGP includes a signal transmission path SGP in which a signal SG3 is transmitted. The plurality of signal transmission paths SGP includes a signal transmission path SGP4 in which a signal SG4 is transmitted. The signals SG1, SG2, SG3, and SG4 are different signals from each other. Each of the signals SG1, SG2, SG3, and SG4 is the signal SGT (see FIG. 1) which is an output signal or the signal SCR (see FIG. 1) which is an input signal. Each of the signals SG1, SG2, SG3, and SG4 is a data signal transmitted at a transmission speed of, for example, 1.6 Gbps or more. However, as a modification, a part or all of the signals SG1, SG2, SG3, and SG4 may be an address signal or a command signal.

As shown FIG. 2, a semiconductor chip (semiconductor component, electronic component) CHP1 provided in the semiconductor device PKG1 includes a plurality of electrodes 3PD. The plurality of electrodes 3PD provided in the semiconductor chip CHP1 includes signal transmission electrodes Sx. Each of the plurality of signal transmission paths SGP is connected to the signal transmission electrode Sx provided in the semiconductor chip CHP1. In FIG. 2, four signal transmission paths SGP of the plurality of signal transmission paths SGP provided in the semiconductor device PKG1 are shown as a representative. However, the number of signal transmission paths SGP provided in the semiconductor device PKG1 is larger than the number shown in FIG. 2.

Although details will be described later, in order to improve the transmission quality in the signal transmission path SGP which is a high-speed transmission path, it is preferable to make the impedance (specifically, the characteristic impedance) of each of the plurality of signal transmission paths SGP match with a design value (for example, 50Ω).

Further, the plurality of electrodes 3PD provided in the semiconductor chip CHP1 includes an electrode (reference potential electrode) Vs to which a reference potential VSS is supplied and an electrode (power supply potential electrode) Vd to which a power supply potential VDD is supplied. The power supply potential VDD is supplied to the semiconductor chip CHP1 (specifically, the circuit provided in the semiconductor chip CHP1) via a power supply potential supply path VDP. Also, the reference potential VSS is supplied to the semiconductor chip CHP1 (specifically, the circuit provided in the semiconductor chip CHP1) via a reference potential supply path VSP, At least some of the plurality of circuits provided in the semiconductor chip CHP1 are driven by a driving voltage generated by a potential difference between the power supply potential VDD and the reference potential VSS. The reference potential VSS is, for example, the ground potential, and the power supply potential VDD is higher than the reference potential VSS.

<Semiconductor Device>

Figure 3:
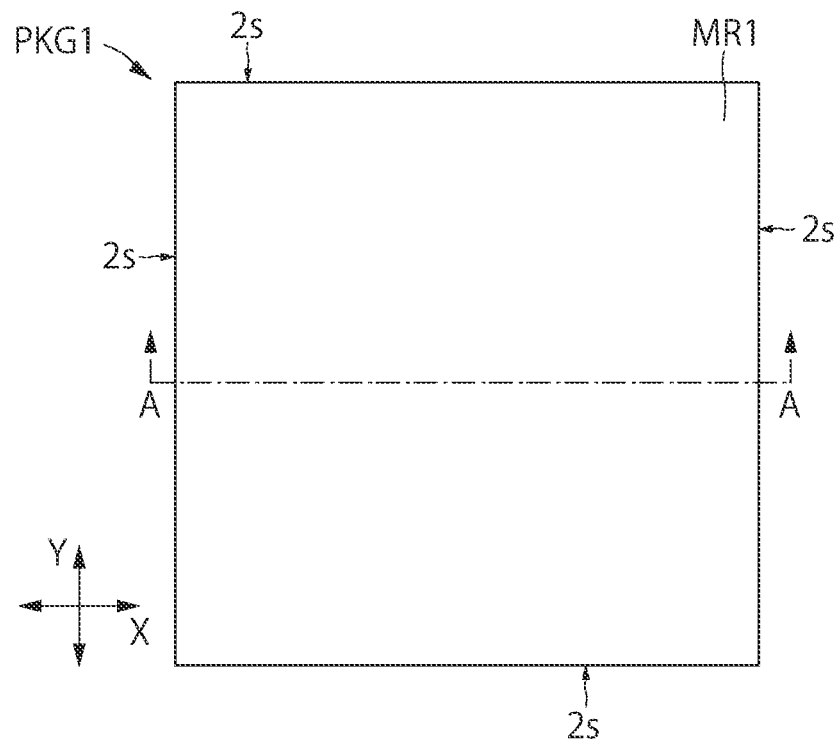
FIG. 3 is a top view of one of the two semiconductor devices shown in FIG. 1.
Figure 4:
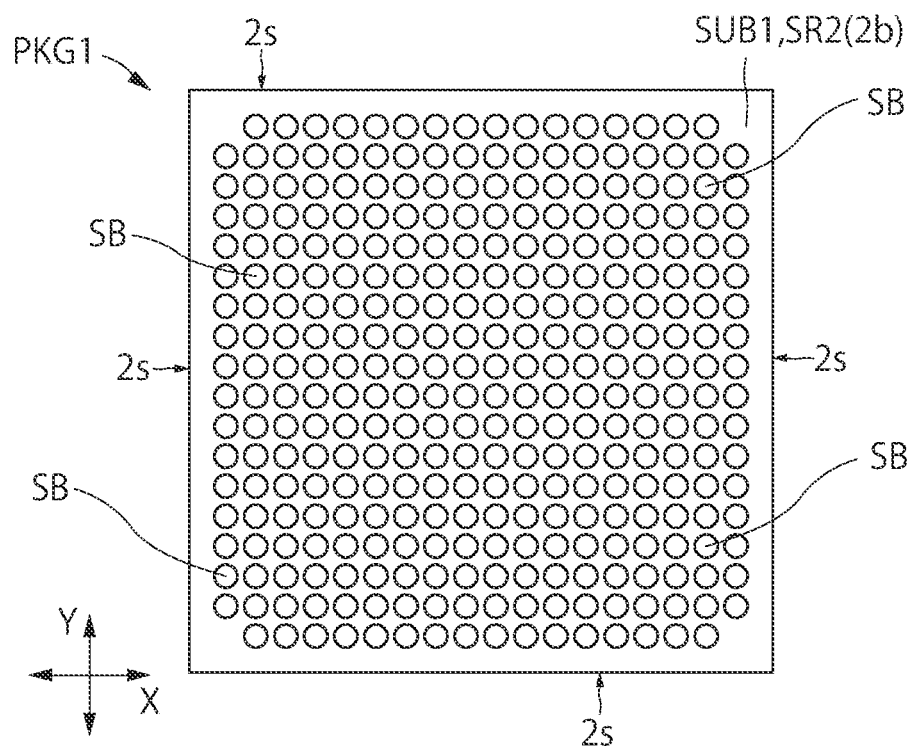
FIG. 4 is a bottom view of the semiconductor device shown in FIG. 3.
Figure 5:
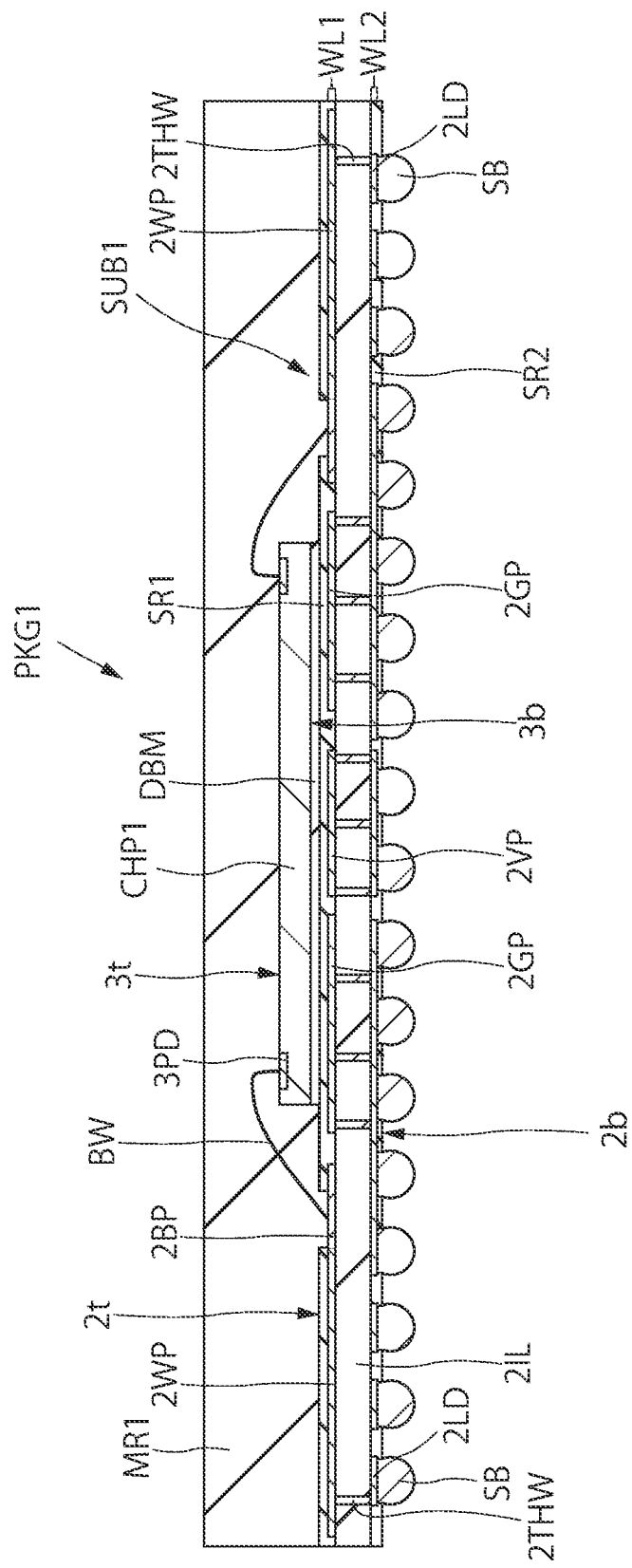
FIG. 5 is a cross-sectional view along a line A-A in FIG. 3.
Figure 6:
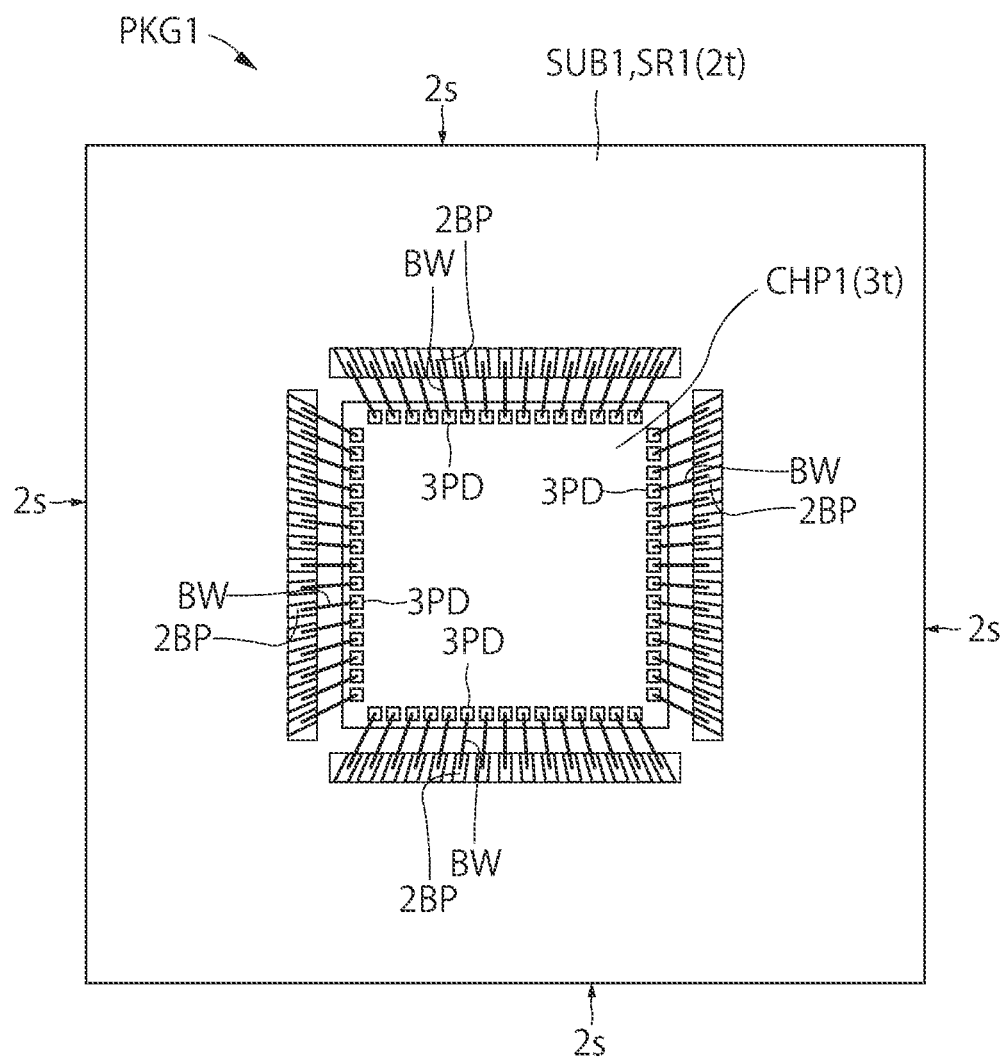
FIG. 6 is a top view showing a state when a sealing body shown in FIG. 3 is eliminated.

A structure example of the signal transmission path in the semiconductor device PKG1 will be described based on the semiconductor device PKG1 shown in FIG. 1 as an example. First, the outline of the semiconductor device PKG1 will be described, and then the structure of the signal transmission path will be described. FIG. 3 is a top view of one of the two semiconductor devices shown in FIG. 1. FIG. 4 is a bottom view of the semiconductor device shown in FIG. 3. FIG. 5 is a cross-sectional view along a line A-A in FIG. 3. FIG. 6 is a top view showing a state when a sealing body shown in FIG. 3 is eliminated.

The semiconductor device PKG1 according to the present embodiment shown in FIG. 5 includes a wiring substrate SUB1, the semiconductor chip CHP1 mounted on the wiring substrate SUB1, and a bonding wire BW electrically connected to each of the wiring substrate SUB1 and the semiconductor chip CHP1.

The wiring substrate SUB1 has an upper surface (surface, main surface, chip mounting surface) $2t$ on which the semiconductor chip CHP1 is mounted and a lower surface (surface, main surface, mounting surface, second main surface) $2b$ opposite the upper surface $2t$. Further, the wiring substrate SUB1 has a plurality of side surfaces $2s$ (see FIG. 3 and FIG. 4) continuous to outer edges of the upper surface $2t$ and the lower surface $2b$. In the case of the present embodiment, the upper surface $2t$ (see FIG. 5) and the lower surface $2b$ (see FIG. 4) of the wiring substrate SUB1 are quadrangular.

The wiring substrate SUB1 is an interposer (relay board) that electrically connects the semiconductor chip CHP1 mounted on the upper surface $2t$ and the wiring substrate MB1 (see FIG. 1) which is a motherboard (mounting board). The wiring substrate SUB1 has wiring layers WL1 and WL2 that electrically connect an internal interface terminal (bonding pad 2PD) on a side of the upper surface $2t$ which is the chip mounting surface and an external terminal (land 2LD) on a side of the lower surface $2b$ which is the mounting surface. Each of the wiring layer WL1 and the wiring layer WL2 has a conductor pattern such as a wiring which is a path for supplying an electric signal or electric power. Also, an insulating layer 2IL is arranged between the wiring layer WL1 and the wiring layer WL2. The wiring layer WL1 and the wiring layer WL2 are electrically connected to each other via a through hole wiring 2THW which is an interlayer conductive path penetrating the insulating layer 2IL. In the example shown in FIG. 5, wiring layers provided in the wiring substrate SUB1 are only the two layers of the wiring layer WL1 and the wiring layer WL2.

The basic structure of the wiring substrate SUB1 shown in FIG. 5 and FIG. 6 can be expressed as follows. The wiring layer WL1 is arranged on the insulating layer 2IL. A plurality of bonding pads 2PD to which a plurality of bonding wires BW is respectively connected is formed in the wiring layer WL1. A plurality of lands 2LD which is an external terminal is formed in the wiring layer WL2. The insulating layer 2IL is arranged between the wiring layer WL1 and the wiring layer WL2.

The plurality of bonding pads 2PD and the plurality of lands 2LD are electrically connected to each other via a conductor pattern such as a wiring pattern 2WP, a ground pattern 2GP to which the reference potential is supplied, or a power supply pattern 2VP to which the power supply potential is supplied and the through hole wiring 2THW which is an interlayer conductive path that electrically connects the wiring layer WL1 and the wiring layer WL2.

In addition, the wiring layer WL1 is covered with an insulating film (solder resist film) SR1. An opening is formed in the insulating film SR1, and each of the plurality of bonding pads 2PD is exposed from the insulating film SR1 in the opening. The wiring layer WL2 is covered with an insulating film (solder resist film) SR2. An opening is formed in the insulating film SR2, and each of the plurality of lands 2LD is exposed from the insulating film SR2 in the opening.

In the example shown in FIG. 5, a solder ball (solder material, external terminal, electrode, external electrode) SB is connected to each of the plurality of lands 2LD. The solder ball SB is a conductive member that electrically connects a plurality of terminals (not shown) on the side of the wiring substrate MB1 and the plurality of lands 2LD when the semiconductor device PKG1 is mounted on the wiring substrate MB1 shown in FIG. 1. The solder ball SB is, for example, an Sn—Pb solder material containing lead (Pb) or a solder material made of so-called lead-free solder that substantially contains no Pb. Examples of lead-free solder include, for example, tin (Sn) only, tin-bismuth (Sn—Bi), tin-copper-silver (Sn—Cu—Ag), tin-copper (Sn—Cu), and the like. Here, the lead-free solder means the solder whose content of lead (Pb) is 0.1 wt % or less, and this content is defined as the standard of the RoHS (Restriction of Hazardous Substances) directive.

As shown in FIG. 4, the plurality of solder balls SB is arranged in a matrix shape (array shape). Further, although not shown in FIG. 4, the plurality of lands 2LD (see FIG. 5) to which the plurality of solder balls SB is bonded is also arranged in a matrix shape. The semiconductor device in which a plurality of external terminals (solder balls SB, lands 2LD) is arranged in a matrix shape on the side of the mounting surface of the wiring substrate SUB1 in this way is referred to an area array type semiconductor device. The area array type semiconductor device is favorable because the side of the mounting surface (lower surface $2b$) of the wiring substrate SUB1 can be effectively used as a space for arranging the external terminals and the increase in the mounting area of the semiconductor device can be suppressed even if the number of external terminals increases. Even the semiconductor device in which the number of external terminals increases due to higher functionality and higher integration can be mounted in a space-saving manner.

As shown in FIG. 5, the semiconductor chip CHP1 has a front surface (main surface, upper surface) $3t$ and a back surface (main surface, lower surface) $3b$ opposite the front surface $3t$. As shown in FIG. 3, the semiconductor chip CHP1 has a quadrangular outer shape having a smaller planar area than the wiring substrate SUB1 in a plan view. In the example shown in FIG. 6, the semiconductor chip CHP1 is mounted in a central region of the upper surface $2t$ of the wiring substrate SUB1 (the region including the center of the upper surface $2t$).

As shown in FIG. 6, the plurality of electrodes 3PD is arranged on the peripheral edge of the front surface $3t$ of the semiconductor chip CHP1, In the example shown in FIG. 6, the plurality of electrodes 3PD is arranged in a row along each side of the front surface 3t. However, as a modification, the electrodes 3PD may be arranged in a plurality of rows.

Further, as shown in FIG. 5, the semiconductor chip CHP1 is mounted on the wiring substrate SUB1 with the back surface 3b facing the upper surface 2t of the wiring substrate SUB1. Specifically, a die bonding material DBM is arranged between the insulating film SR1 having the upper surface 2t of the wiring substrate SUB1 and the back surface 3b of the semiconductor chip CHP1. The semiconductor chip CHP1 is bonded and fixed on the insulating film SRI of the wiring substrate SUB1 via the die bonding material DBM. Such a mounting method is called a face-up mounting method. In the case of the face-up mounting method, the bonding wire BW is used as a conductive member for electrically connecting the electrode 3PD of the semiconductor chip and the bonding pad 2PD of the wiring substrate SUB1.

Although not shown, a plurality of semiconductor elements (circuit elements) is formed on the main surface of the semiconductor chip CHP1 (specifically, a semiconductor element forming region provided on the element forming surface of the semiconductor substrate which is the base material of the semiconductor chip CHP1). The plurality of electrodes 3PD is electrically connected to the plurality of semiconductor elements via a wiring (not shown) formed in a wiring layer arranged inside the semiconductor chip CHP1 (specifically, between the front surface 3t and a semiconductor element forming region (not shown)).

The semiconductor chip CHP1 (specifically, the base material of the semiconductor chip CHP1) is made of, for example, silicon (Si). Also, an inorganic insulating film covering the base material and wiring of the semiconductor chip CHP1 is formed on the front surface 3t, and a part of each of the plurality of electrodes 3PD is exposed from the insulating film at the opening formed in the inorganic insulating film. Further, each of the plurality of electrodes 3PD is made of metal, and it is made of, for example, aluminum (Al) in the present embodiment.

As shown in FIG. 5, one end of the bonding wire SW is bonded to the electrode 3PD. The other end of the bonding wire SW is bonded to the bonding pad 2PD. The bonding wire SW is a thin metal wire made of a metal material such as gold or copper. In the example shown in FIG. 5, the end connected to the electrode BPD is a first bonding side, and the end connected to the bonding pad 2PD is a second bonding side. Such a connection method is called a forward bonding method. However, although not shown, in a modification with respect to FIG. 5, the end connected to the electrode 3PD is the second bonding side, and the end connected to the bonding pad 2PD is the first bonding side. The connection method in this modification is called a reverse bonding method.

Further, a sealing body MR1 is formed on the upper surface 2t of the wiring substrate SUB1. The sealing body is, for example, a resin body obtained by thermosetting a resin material in which an inorganic filler, a black pigment, or the like is mixed with a thermosetting resin serving as a base. Each of the semiconductor chip CHP1, the plurality of bonding wires BW, and the plurality of bonding pads 2PD is sealed by the sealing body MR1. By sealing the plurality of bonding wires BW, it is possible to prevent deformation and short-circuit between adjacent bonding wires BW in the completed semiconductor device PKG1.

<Wiring Layout>

Figure 7:
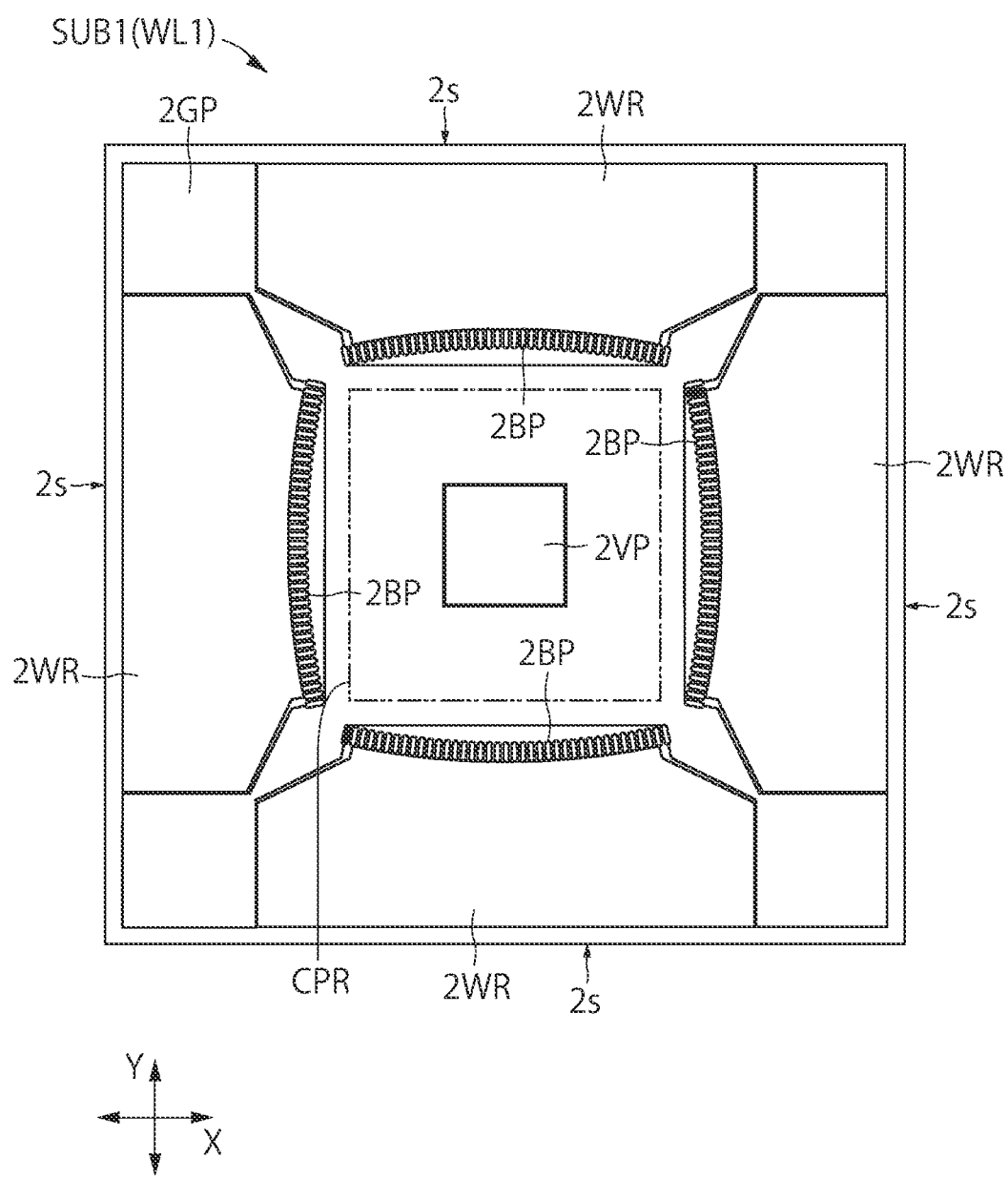
FIG. 7 is a plan view showing an example of a wiring layout of the wiring substrate shown in FIG. 5.

Next, the wiring in the wiring substrate SUB1 shown in FIG. 5 and FIG. 6 will be described with reference to specific examples. FIG. 7 is a plan view showing an example of the wiring layout of the wiring substrate shown in FIG. 5. In FIG. 7, a region in which a plurality of wiring patterns is formed is shown as a wiring region WR. Also, in FIG. 7, a region overlapping with the semiconductor chip CHP1 shown in FIG. 5 is indicated by a two-dot chain line as a region (chip region) CHR.

In the description of the present embodiment, the "wiring pattern" is a conductor film that electrically connects two or more terminal patterns and is extended linearly. The wiring pattern is distinguished from the bonding pad 2BP (see FIG. 7), a through hole land 2THL, (see FIG. 8) a ground pattern 2BP (see FIG. 7), or a power supply pattern 2VP (see FIG. 7) in that it is a linearly extending pattern. For example, the bonding pad 2BP (see FIG. 7) formed in the wiring layer WL1 (see FIG. 7) and the through hole land 2THL (see FIG. 8) are electrically connected via a wiring pattern. Further, a plurality of through hole lands 2THL may be electrically connected via a wiring pattern.

In addition, although details will be described later, the wiring pattern includes a "transmission wiring portion" that functions as a path for transmitting signals and potentials during an operation of the semiconductor device and a "power feeding wiring portion" that is used as a power feeding path at the time when an electrolytic plating process is performed in the manufacturing process of the semiconductor device. One end of the power feeding wiring portion is connected to the transmission wiring portion, and the other end thereof is arranged on the peripheral edge of the wiring substrate.

As mentioned above, in recent years, there has been a demand for miniaturization and high signal transmission speed even for low-cost type semiconductor devices. By increasing the signal transmission speed of the semiconductor device, the processing performance of the semiconductor device PKG1 can be improved.

In order to increase the signal transmission speed of the semiconductor device, it is necessary to increase the number of signal transmission paths provided in the semiconductor device and increase the signal transmission speed in each of the plurality of signal transmission paths. For example, the semiconductor device PKG1 according to the present embodiment shown in FIG. 2 includes a signal transmission path SGP that transmits a signal at a transmission speed of, for example, 1.6 Gbps (Gigabit per second).

In order to increase the signal transmission speed of each of the plurality of signal transmission paths, it is necessary to increase the signal frequency, and it is necessary to take measures for transmission loss and noise. Therefore, when considering the increase in the signal transmission speed of the semiconductor device, the structure of the semiconductor device tends to be complicated. For example, from the viewpoint of realizing higher density of electrodes which are terminals of the semiconductor chip, the flip chip connection method in which the electrode array arranged in a matrix shape and the wiring substrate are electrically connected in the state of facing each other is preferable. Further, for example, in order to provide a large number of signal transmission paths, a method of using a multi-layer wiring substrate formed by increasing the number of wiring layers provided in the wiring substrate is conceivable.

However, if the above method is adopted, the manufacturing process of the semiconductor device becomes complicated and the manufacturing cost increases, so that the merit of the low-cost type semiconductor device is lost. Therefore, the inventors of this application have studied the technology for increasing the signal transmission speed of the semiconductor device PKG1 which is premised on that the semiconductor chip CHP1 and the wiring substrate SUB1 are electrically connected via the bonding wire BW and the number of wiring layers of the wiring substrate SUB1 is two layers as in the semiconductor device PKG1 shown in FIG. 5.

One of the important factors in increasing the signal transmission speed of the semiconductor device PKG1 is to make the impedance (specifically the characteristic impedance) of each of the plurality of signal transmission paths SGP shown in FIG. 2 match with a design value (for example, 50Ω). Transmission loss can be reduced by the matching of the characteristic impedance of the signal transmission path. In particular, in the case of a semiconductor device in which the semiconductor chip CHP1 and the wiring substrate SUB1 are electrically connected via the bonding wire BW, the characteristic impedance tends to be high around the bonding wire BW. Therefore, it is preferable to reduce the characteristic impedance of the signal transmission path by devising the structure around the wiring pattern connected to the bonding wire BW.

Further, in the case of the wiring substrate SUB1, it is necessary to electrically connect the plurality of bonding wires BW and the plurality of lands 2LD serving as external terminals by the two wiring layers of the wiring layer WL1 and the wiring layer WL2. The wiring pattern connecting the plurality of bonding pads 2PD and the plurality of lands 2LD is mainly arranged in the wiring layer WL1. Therefore, since it is necessary to arrange the wiring pattern within a limited space in the wiring layer WL1, there is a restriction in the wiring layout. For example, ideally, it is preferable that wiring patterns to which a reference potential is supplied are arranged on both sides of the wiring pattern included in the signal transmission path.

However, if the number of wiring patterns to which the reference potential is supplied increases, the area of the wiring substrate will increase. Therefore, from the viewpoint of reducing the planar size of the wiring substrate, a plurality of signal transmission wiring patterns is arranged next to each other in some cases. In this case, among the three signal transmission wiring patterns, the wiring pattern in the middle has a longer distance to the wiring pattern to which the reference potential is supplied, as compared with the other wiring patterns. Therefore, measures to suppress the increase in the characteristic impedance need to be taken particularly for the wiring pattern sandwiched between the signal transmission wiring patterns.

As one method of suppressing the increase in the characteristic impedance in the wiring pattern serving as a signal transmission path, a method of arranging a conductor pattern capacitively coupled with the wiring pattern near the wiring pattern is effective. Since the value of the characteristic impedance of the signal transmission path is proportional to the reciprocal of the capacitance, the value of the characteristic impedance can be reduced by increasing the capacitance.

Figure 8:
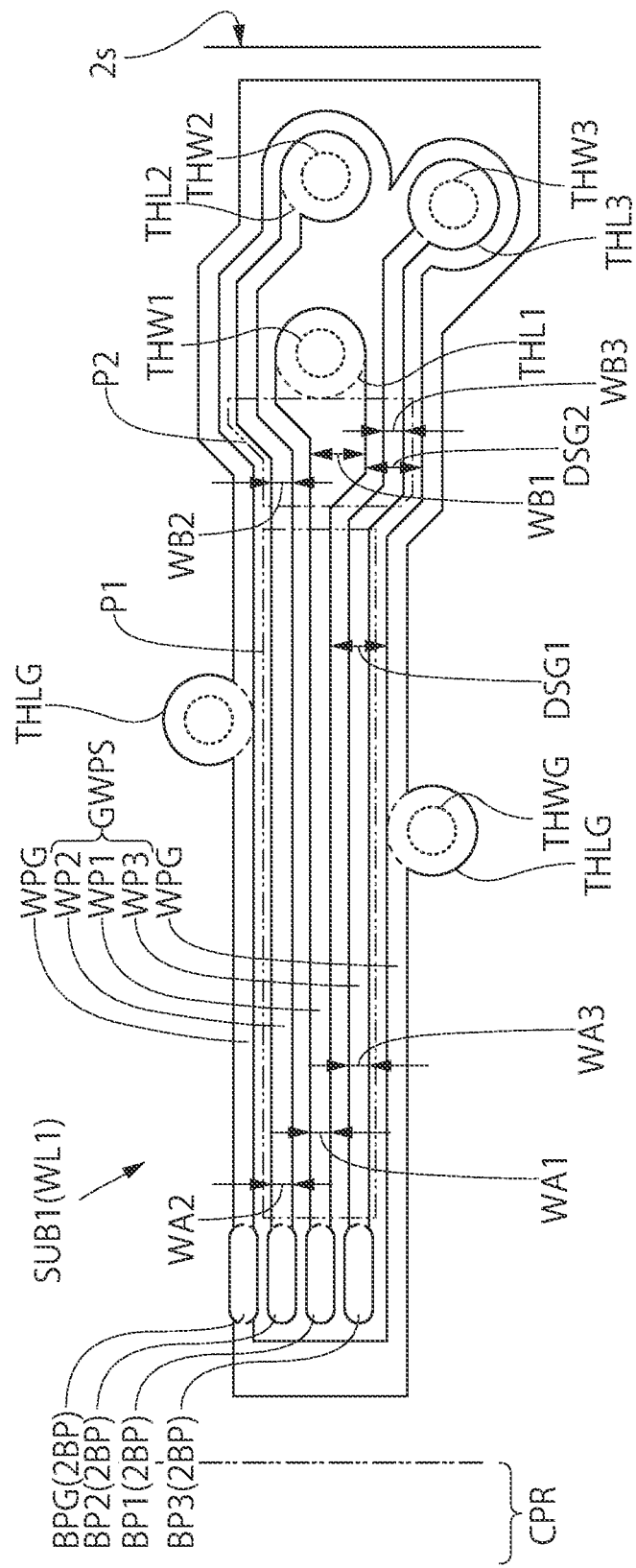
FIG. 8 is a plan view schematically showing a part of a plurality of wiring patterns arranged in a wiring region WR shown in FIG. 7.
Figure 9:
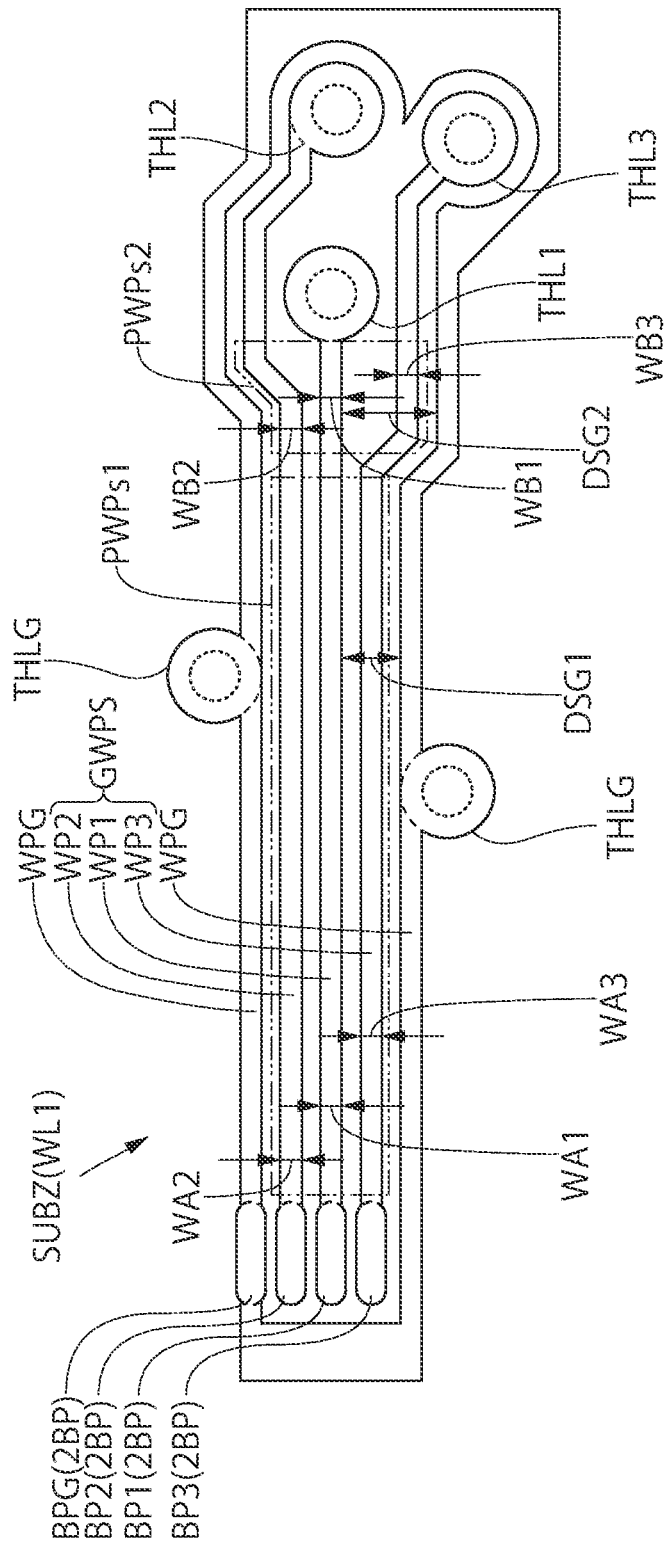
FIG. 9 is a plan view showing a studied example with respect FIG. 8.

Based on the above, a structure example of the semiconductor device PKG1 according to the present embodiment will be described. FIG. 8 is a plan view schematically showing a part of a plurality of wiring patterns arranged in the wiring region WR shown in FIG. 7. FIG. 9 is a plan view showing a studied example with respect to FIG. 8.

As shown in FIG. 8, the wiring layer WL1 includes the following wiring patterns in addition to the bonding pad 2PD. Namely, the wiring layer WL1 includes a wiring pattern WP1 which is a transmission path of the signal SG1 (see FIG. 2), a wiring pattern WP2 which is a transmission path of the signal SG2 (see FIG. 2) different from the signal SG1 and is arranged next to one side of the wiring pattern WP1, and a wiring pattern WP3 which is a transmission path of the signal SG3 (see FIG. 2) different from the signal SG1 and the signal SG2 and is arranged next to the other side of the wiring pattern WP1. The wiring layer WL1 further includes two ground wiring patterns WPG which are a transmission path of the reference potential VSS (see FIG. 2) and are extended along the wiring pattern WP2 or the wiring pattern WP3 so as to arrange each of the wiring pattern WP1, the wiring pattern WP2, and the wiring pattern WP3 therebetween.

A wiring pattern group GWPS including the wiring pattern WP1, the wiring pattern WP2, and the wiring pattern WP3 has a portion P1 and a portion P2. In the portion P1, wiring widths (wiring widths WA1, WA2, and WA3 shown in FIG. 8) of the wiring pattern WP1, the wiring pattern WP2, and the wiring pattern WP3 are equal to each other. On the other hand, in the portion P2, among the wiring pattern WP1, the wiring pattern WP2, and the wiring pattern WP3, a wiring width WB1 of the wiring pattern WP1 is larger than a wiring width WB2 of the wiring pattern WP2 and a wiring width WB3 of the wiring pattern WP3.

In the example shown in FIG. 8, the wiring widths WA1, WA2, WA3, WB2, and WB3 are equal to each other. On the other hand, the wiring width WB1 is larger than the wiring widths WA1, WA2, WA3, WB2, and WB3.

In the case of the present embodiment, since the wiring width WB1 of the wiring pattern WP1 is larger than each of the wiring width WB2 of the wiring pattern WP2 and the wiring width WB3 of the wiring pa ern WP3 in the portion P2, the following effects can be obtained. That is, a separation distance DSG2 between the wiring pattern WP1 and the ground wiring pattern WPG in the portion P2 is about the same (the same in the example shown in FIG. 8) as a separation distance DSG1 between the wiring pattern WP1 and the ground wiring pattern WPG in the portion P1.

In the case of a wiring substrate SUBZ shown in FIG. 9 as a studied example, the wiring substrate SUBZ is different from the wiring substrate SUB1 shown in FIG. 8 in that the wiring widths WA1 and WB1 of the wiring pattern WP1 are equal to each other. In the case of the wiring substrate SUBZ, the separation distance DSG2 between the wiring pattern WP1 and the ground wiring pattern WPG in the portion P2 is larger than the separation distance DSG1 between the wiring pattern WP1 and the ground wiring pattern WPG in the portion P1. The capacitance component given to the signal transmission path including the wiring pattern WP1 becomes larger as the separation distance to the ground wiring pattern WPG extended in parallel with the wiring pattern WP1 is smaller. In other words, the characteristic impedance of the signal transmission path including the wiring pattern WP1 can be reduced as the separation distance to the ground wiring pattern WPG extended in parallel with the wiring pattern WP1 is smaller.

In the case of the wiring substrate SUB1 shown in FIG. 8, the capacitance component given to the wiring pattern WP1 in the portion P2 can be increased as compared with the wiring substrate SUBZ shown in FIG. 9. As a result, the characteristic impedance of the signal transmission path including the wiring pattern WP1 can be reduced.

As shown in FIG. 8, the separation distance between the wiring pattern WP1 and the wiring pattern WP2, the separation distance between the wiring pattern WP1 and the wiring pattern WP3, the separation distance between the wiring pattern WP2 and the ground wiring pattern WPG, and the separation distance between the wiring pattern WP3 and the ground wiring pattern WPG are equal to each other.

Also, the wiring layer WL1 further includes a bonding pad BP1 which is electrically connected to the wiring pattern WP1 and to which the bonding wire BW (see FIG. 5) is bonded and a through hole land THL1 to which the wiring pattern WP1 and a through hole wiring THW1 are bonded. Similarly, the wiring layer WL1 further includes a bonding pad BP2 which is electrically connected to the wiring pattern WP2 and to which the bonding wire BW (see FIG. 5) is bonded and a through hole land THL2 to which the wiring pattern WP2 and a through hole wiring THW2 are bonded. Similarly, the wiring layer WL1 further includes a bonding pad BP3 which is electrically connected to the wiring pattern WP3 and to which the bonding wire BW (see FIG. 5) is bonded and a through hole land THL3 to which the wiring pattern WP3 and a through hole wiring THW3 are bonded. In addition, the wiring layer WL1 further includes a bonding pad BPG which is electrically connected to the ground wiring pattern WPG and to which the bonding wire BW (see FIG. 5) is bonded and a through hole land THLG to which the ground wiring pattern WPG and a through hole wiring THWG are bonded.

In the example shown in FIG. 8, each of the wiring pattern WP1, the bonding pad BP1, and the through hole land THL1 is integrally formed. Similarly, each of the wiring pattern WP2, the bonding pad BP2, and the through hole land THL2 is integrally formed. Each of the wiring pattern WP3, the bonding pad BP3, and the through hole land THL3 is integrally formed. Each of the ground wiring pattern WPG, the bonding pad BPG, and the through hole land THLG is integrally formed.

Figure 10:
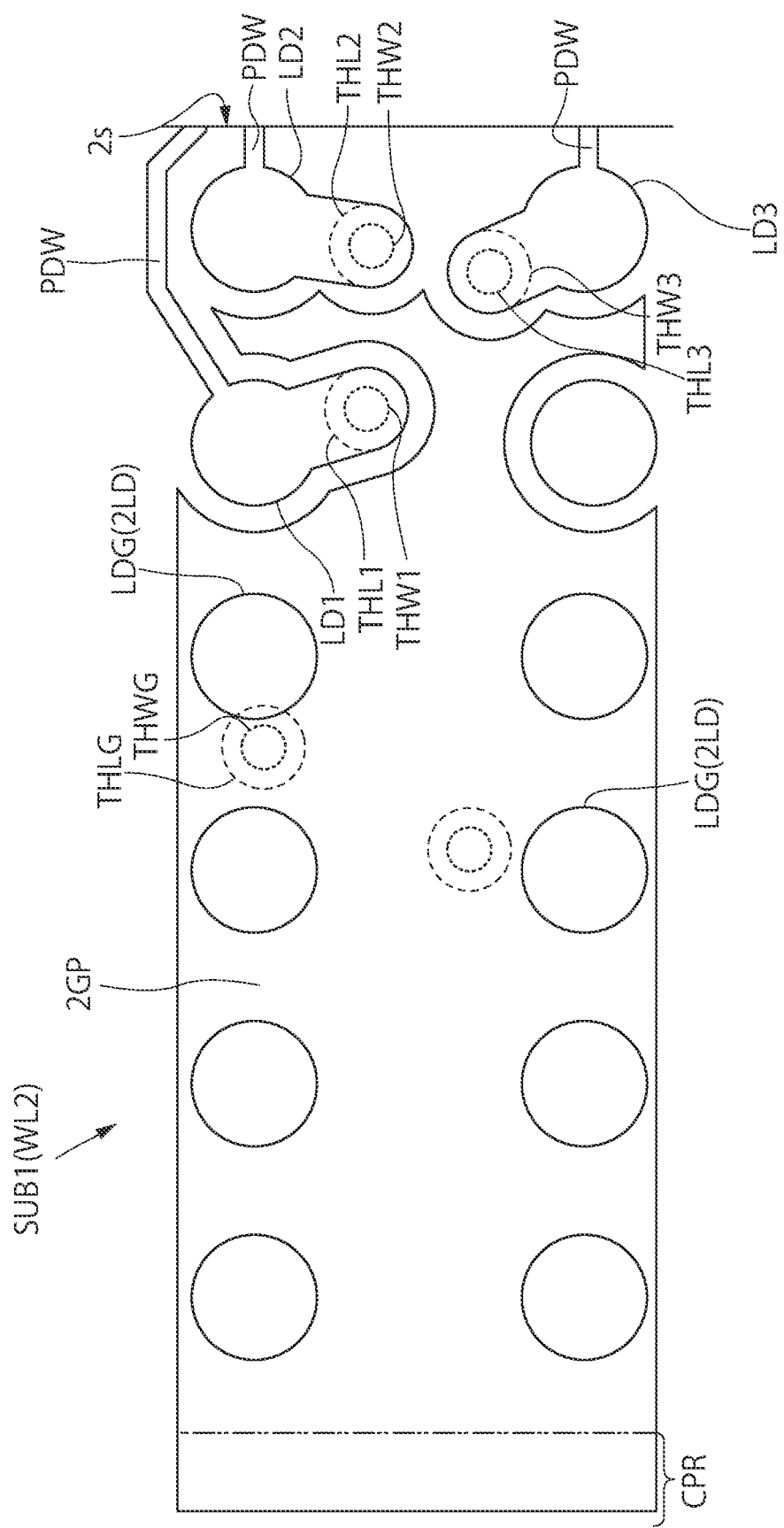
FIG. 10 is an enlarged plan view of a second wiring layer located opposite the wiring substrate shown in FIG. 9.

FIG. 10 is an enlarged plan view of a second wiring layer located opposite the wiring substrate shown in FIG. 9. As shown in FIG. 10, the plurality of lands 2LD formed in the wiring layer WL2 of the wiring substrate SUB1 includes a land LD1 connected to the through hole wiring THW1, a land LD2 connected to the through hole wiring THW2, a land LD3 connected to the through hole wiring THW3, and a land LDG connected to the through hole wiring THWG. The land LDG is a part of the ground pattern 2GP which is a large-area conductor pattern, The plurality of lands LDG is connected to each other via the ground pattern 2GP. On the other hand, the lands LD1, LD2, and LD3 which are a part of the signal transmission path are separated from each other.

In the example shown in FIG. 10, a power feeding wiring PDW is connected to each of the lands LD1, LD2, and LD3. In the manufacturing process of the semiconductor device PKG1 (see FIG. 5), when the conductor pattern of the wiring substrate SUB1 is formed by the electrolytic plating method, the power feeding wiring PDW is used as the wiring for supplying electric power to the seed layer of the conductor pattern. When the power feeding wiring PDW is formed in the wiring layer WL2 as shown in FIG. 10, it is not always necessary to form the power feeding wiring PDW in the wiring layer WL1. In this case, when the conductor pattern of the wiring layer WL1 shown in FIG. 8 is formed by the electrolytic plating method, electric power is supplied from the power feeding wiring PDW shown in FIG. 10 via the through hole wiring.

Modification 1

Figure 11:
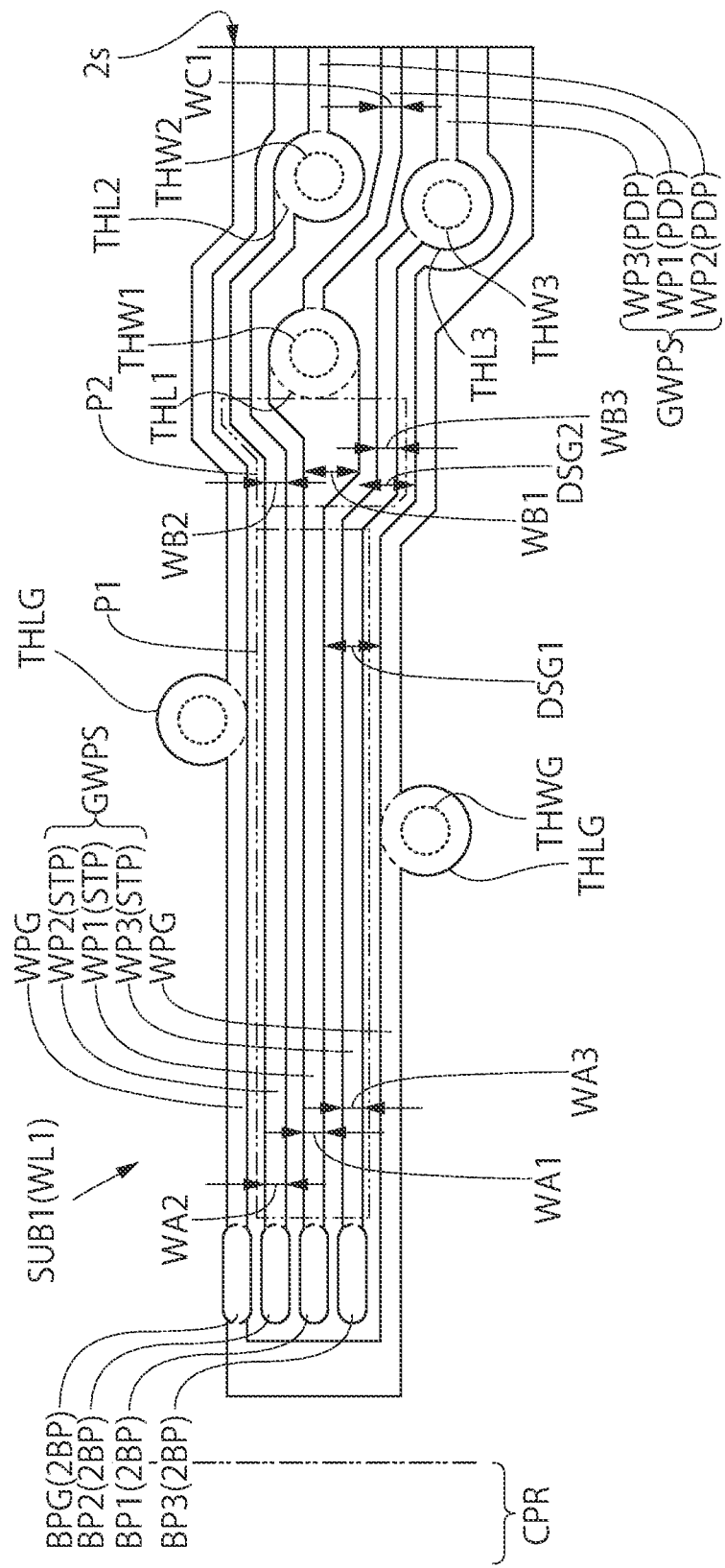
FIG. 11 is an enlarged plan view of a wiring substrate which is a modification with resect to the wiring substrate shown in FIG. 8.

FIG. 11 is an enlarged plan view of a wiring substrate which is a modification with respect to the wiring substrate shown in FIG. 8. A wiring substrate SUB2 shown in FIG. 11 is different from the wiring substrate SUB1 shown in FIG. 8 in that the power feeding wiring is formed in the wiring layer WL1. Specifically, the wiring pattern WP1 includes a signal transmission wiring portion STP between the bonding pad BP1 and the through hole land THL1 and a power feeding wiring portion PDP extended from the through hole land THL1 to the outer edge of the wiring substrate SUB2. The portion P2 of the wiring pattern group GWPS exists in the signal transmission wiring portion STP of the wiring pattern WP1.

In the case of the example shown in FIG. 11, the wiring pattern WP2 includes the signal transmission wiring portion STP between the bonding pad BP2 and the through hole land THL2 and the power feeding wiring portion PDP extending from the through hole land THL2 to the outer edge of the wiring substrate SUB2. The portion P2 of the wiring pattern group GWPS exists in the signal transmission wiring portion STP of the wiring pattern WP2.

Similarly, in the case of the example shown in FIG. 11, the wiring pattern WP3 includes the signal transmission wiring portion STP between the bonding pad BP3 and the through hole land THL3 and the power feeding wiring portion PDP extended from the through hole land THL3 to the outer edge of the wiring substrate SUB2. The portion P2 of the wiring pattern group GWPS exists in the signal transmission wiring portion STP of the wiring pattern WP3.

Since the portion P2 to which the capacitance is given by increasing the wiring width WB1 of the wiring pattern WP1 is formed in the signal transmission wiring portion STP, a great effect of lowering the characteristic impedance can be expected. On the other hand, although the power feeding wiring portion PDP is connected to the signal transmission path, it is rarely used as the signal transmission path. Therefore, the power feeding wiring portion POP functions as a stub wiring on the circuit of the signal transmission path. When the capacitance is given by increasing the wiring width of the power feeding wiring portion PDP that functions as the stub wiring, it is possible to contribute to the reduction of the characteristic impedance of the signal transmission path. Therefore, as a modification considering the reduction of the characteristic impedance, a wiring width WC1 of the power feeding wiring portion PDP of the wiring pattern WP1 may be larger than the wiring width WA1 of the wiring pattern WP1 in the portion P1 of the wiring pattern group GWPS.

However, when considering the problems in the manufacturing process of the semiconductor device, it is preferable that the wiring width of the power feeding wiring portion PDP is narrowed within a range in which the electric power required for performing the electrolytic plating process can be supplied. Namely, the power feeding wiring portion PDP is extended to the peripheral end (the portion reaching the side surface 2s) of the wiring substrate SUB1, In the manufacturing process of a semiconductor device, the peripheral end of the wiring substrate SUB1 is cut by a rotary blade called a dicing blade (not shown). If the amount of the metal film arranged at the peripheral end of the wiring substrate SUB1 is large, the metal film may be caught in the dicing blade, which may cause pattern damage or cutting failure.

In consideration of the above, in the case of the present embodiment, the wiring width WC1 of the power feeding wiring portion PDP of the wiring pattern WP1 is equal to or smaller than the wiring width WA1 of the wiring pattern WP1 in the portion P1 of the wiring pattern group GWPS. For example, in the example shown in FIG. 11, the wiring width WC1 of the power feeding wiring portion PDP of the wiring pattern WP1 is the same as the wiring width WA1 of the wiring pattern WP1 in the portion P1 of the wiring pattern group GWPS. Although not shown, the wiring width WC1 may be narrower than the wiring width WA1 as a modification. In this way, it is possible to suppress the occurrence of pattern damage and cutting failure in the cutting process of the wiring substrate SUB1 by the dicing blade.

Similarly, in the example shown in FIG. 11, the wiring width of the power feeding wiring portion PDP of the wiring pattern WP2 and the wiring width of the power feeding wiring portion PDP of the wiring pattern WP3 are the same as the wiring width WA2 of the wiring pattern WP2 and the wiring width WA3 of the wiring pattern WP3 in the portion P1 of the wiring pattern group GWPS.

When the power feeding wiring portion PDP is connected to each of the conductor patterns formed in the wiring layer WL1 as shown in FIG. 11, it is not always necessary to form the power feeding wiring PDW of the wiring layer WL2 described with reference to FIG. 10. When the conductor patterns of the wiring layers WL1 and WL2 are formed by the electrolytic plating method, the wiring layers WL1 and WL2 can be formed collectively. Therefore, it is sufficient that the power feeding wiring PDW (or the power feeding wiring portion PDP) is formed for each wiring path in at least one of the wiring layer WL1 and the wiring layer WL2.

The wiring substrate SUB2 shown in FIG. 11 is the same as the wiring substrate SUB1 shown in FIG. 8 except for the above-mentioned differences. Also, in the semiconductor device PKG1 described with reference to FIG. 1 to FIG. 6, the wiring substrate SUB2 shown in FIG. 11 can be applied instead of the wiring substrate SUB1. Therefore, in the description of the wiring substrate SUB2, a part that overlaps with the description of the wiring substrate SUB1 will be omitted.

Modification 2

Figure 12:
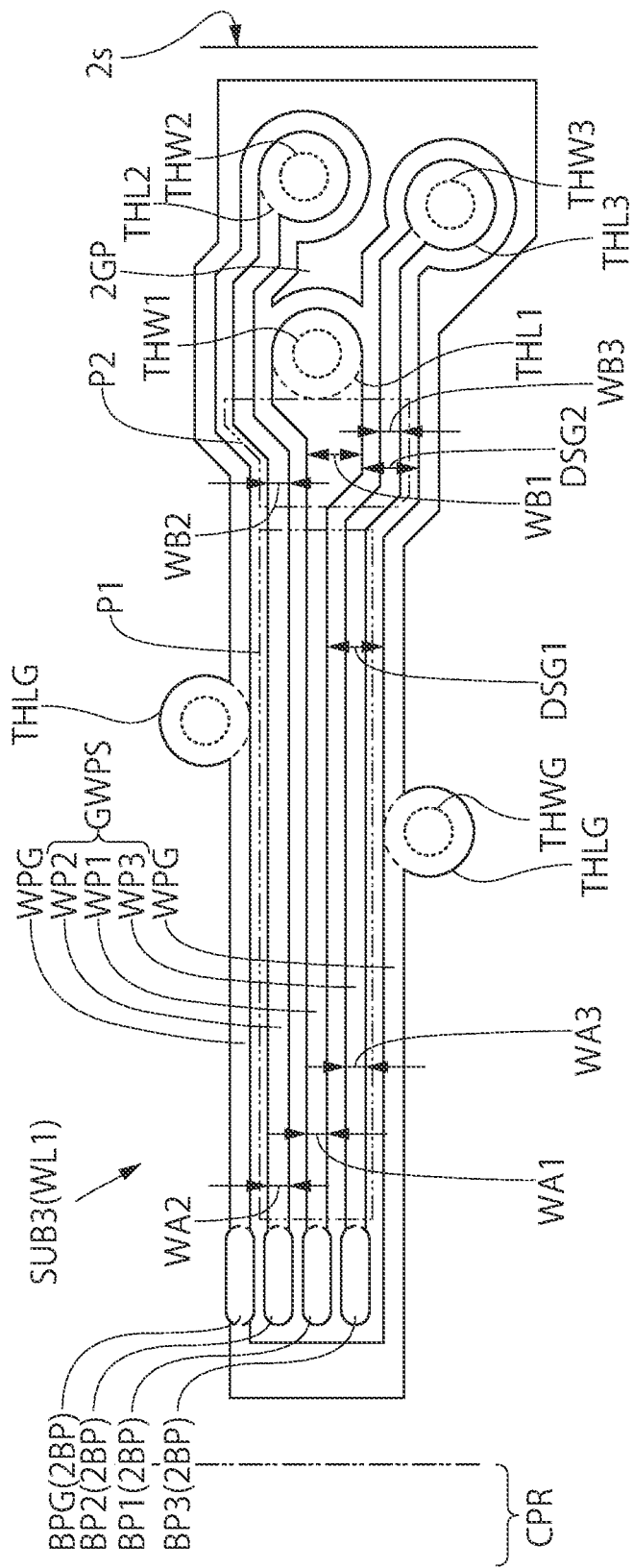
FIG. 12 is an enlarged plan view of a wiring substrate which is another modification with respect to the wiring substrate shown in FIG. 8.

FIG. 12 is an enlarged plan view of a wiring substrate which is another modification with respect to the wiring substrate shown in FIG. 8. A wiring substrate SUB3 shown in FIG. 12 is different from the wiring substrate SUB1 shown in FIG. 8 in that the ground pattern 2GP arranged so as to be adjacent to the through hole land THL1.

Specifically, the wiring layer WL1 includes a bonding pad PD1 which is electrically connected to the wiring pattern WP1 and to which a bonding wire is bonded and the through hole land THL1 to which the wiring pattern WP1 and the through hole wiring THW1 are bonded. Around the through hole land THL1 of the wiring layer WL1, the ground pattern 2GP electrically connected to the ground wiring pattern WPG is arranged so as to be adjacent to the through hole land THL1.

When the power feeding wiring portion PUP is connected to the through hole land THL1 as in the wiring substrate SUB2 shown in FIG. 11, it is difficult to arrange the ground pattern 2GP next to the through hole land THL1. On the other hand, when the ground pattern 2GP is arranged next to the through hole land THL1 as shown in FIG. 12, since the capacitance can be given to the portion of the through hole land THL1, the characteristic impedance of the signal transmission path including the wiring pattern WP1 can be reduced.

Also, the ground pattern 2GP arranged between the wiring pattern WP2 and the wiring pattern WP3 can give capacitance to each of the signal transmission path including the wiring pattern WP2 and the signal transmission path including the wiring pattern WP3. Therefore, the effect of reducing the characteristic impedance of these signal transmission paths can also be obtained.

The wiring substrate SUB3 shown in FIG. 12 is the same as the wiring substrate SUB1 shown in FIG. 8 except for the above-mentioned differences. Also, in the semiconductor device PKG1 described with reference to FIG. 1 to FIG. 6, the wiring substrate SUB2 shown in FIG. 11 can be applied instead of the wiring substrate SUB1. Therefore, in the description of the wiring substrate SUB3, a part that overlaps with the description of the wiring substrate SUB1 will be omitted.

<Arrangement Example of Bonding Wire>

Figure 13:
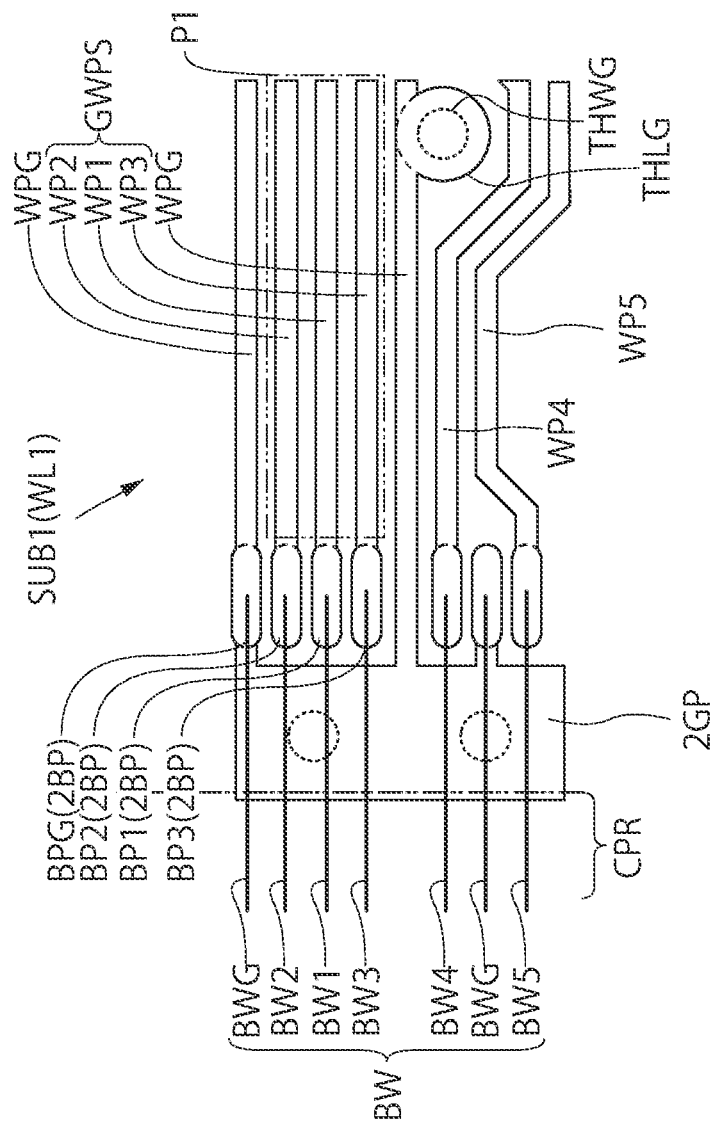
FIG. 13 is an enlarged plan view showing an example of an arrangement of a plurality of bonding wires connected to the wiring substrate shown in FIG. 8.

FIG. 13 is an enlarged plan view showing an example of an arrangement of a plurality of bonding wires connected to the wiring substrate shown in FIG. 8. In the following, an example of the arrangement of the bonding wires will be described while taking the wiring substrate SUB1 shown in FIG. 8 as a representative. However, as a modification, the combination with the wiring substrate SUB2 shown in FIG. 11 or the wiring substrate SUB3 shown in FIG. 12 is also possible.

As shown in FIG. 13, the wiring layer WL1 further includes a wiring pattern WP4 which is a transmission path of the signal SG4 (see FIG. 2) different from the signal SG1 (see FIG. 2), the signal SG2 (see FIG. 2), and the signal SG3 (see FIG. 2) and is arranged next to one of the two ground wiring patterns WPG. Also, the plurality of bonding wires BW connected to the wiring substrate SUB1 includes a bonding wire BW1 electrically connected to the wiring pattern WP1, a bonding wire BW2 electrically connected to the wiring pattern WP2, a bonding wire BW3 electrically connected to the wiring pattern WP3, a bonding wire BW4 electrically connected to the wiring pattern WP4, and two ground bonding wires BWG electrically connected to the two ground wiring patterns WPG, respectively. Each of the bonding wire BW1, the bonding wire BW2, the bonding wire BW3, and the bonding wire BW4 is arranged between the two ground bonding wires BWG.

Namely, in the example of the arrangement of the plurality of bonding wires BW shown in FIG. 13, the four signal transmission bonding wires BW are arranged between the two ground bonding wires BWG. On the other hand, in the wiring layer WL1 of the wiring substrate SUB1, the three signal transmission wiring patterns WP1, WP2, and WP3, which are less than four patterns, are arranged between the two ground wiring patterns WPG.

A large number of electrodes 3PD are densely arranged on the front surface 3t of the semiconductor chip CHP1 shown in FIG. 6. The arrangement density of the plurality of electrodes 3PD is higher than the arrangement density of the plurality of bonding pads 2BP on the wiring substrate SUB1. Therefore, there is a limitation to the total number of bonding wires BW in order to suppress the increase in the planar size of the semiconductor chip CHP1. In this case, the number of bonding wires BW included in the signal transmission path cannot be reduced, and as a result, the number of ground bonding wires BWG (see FIG. 13) is limited. In the example shown in FIG. 13, the ground bonding wires BWG are arranged on both sides of a bundle of the four signal transmission bonding wires BW.

On the other hand, the wiring layer WL1 of the wiring substrate SUB1 has a room in the arrangement space of the conductor pattern as compared with the front surface 3t of the semiconductor chip CHP1 (see FIG. 6). As the number of ground wiring patterns WPG to which the reference potential is supplied increases, the characteristic impedance of the signal transmission path can be reduced. In the example shown in FIG. 13 the ground wiring patterns WPG are arranged on both sides of the bundle of the three signal transmission wiring patterns WP1, WP2, and WP3. Therefore, as in the arrangement of the bonding wires BW, the characteristic impedance of the signal transmission path particularly including the wiring pattern WP3 can be reduced as compared with the case where the wiring pattern WP4 is arranged between the wiring pattern WP3 and the ground wiring pattern WPG.

As shown in FIG. 13, the ground wiring pattern WPG arranged between the wiring pattern WP4 and the wiring pattern WP3 is electrically connected to the bonding pad BPG via the ground pattern 2GP arranged on an inner side of the plurality of bonding pads 2PD (on the side of the region CHR).

In the example shown in FIG. 13, each of the two ground wiring patterns WPG is electrically connected to each other via the ground pattern 2GP. Therefore, the two ground bonding wires BWG are electrically connected to each other. However, since it is sufficient that the reference potential is supplied to each of the two ground bonding wires BWG and the two ground wiring patterns WPG, there are various modifications. For example, there is also the case where the ground pattern WPG next to the wiring pattern WP3 is not connected to the ground pattern 2GP in the wiring layer WL1 shown in FIG. 13. However, even in this case, each of the plurality of ground patterns WPG is electrically connected via the ground pattern 2GP of the wiring layer WL2 shown in FIG. 10.

Also, in the example shown in FIG. 13, the wiring layer WL1 further includes a wiring pattern WP5 connected to a bonding wire BW5 that forms a part of the signal transmission path. The wiring pattern WP4 is arranged between the wiring pattern WP5 and the ground wiring pattern WPG. The wiring pattern WP5 is extended along the wiring pattern WP4.

In the example shown in FIG. 13, among the plurality of bonding wires BW, the number of signal transmission bonding wires BW arranged between the two ground bonding wires DWG is four. However, the number of signal transmission bonding wires BW arranged between the two ground bonding wires BWG may be five or more or equal to the number of signal transmission wiring patterns arranged between the two ground wiring patterns WPG. Further, the number of signal transmission wiring patterns arranged between the two ground wiring patterns WPG may be four or more.

Further, all the signal transmission paths do not have to satisfy the above-mentioned relationship (the number of signal transmission bonding wires BW arranged between the two ground bonding wires BWG is larger than the number of signal transmission wiring patterns arranged between the two ground wiring patterns WPG). Namely, the semiconductor device may be provided with a region in which the number of bonding wires and the number of wiring patterns are equal to each other.

<Capacitance Coupling in Thickness Direction>

Figure 14:
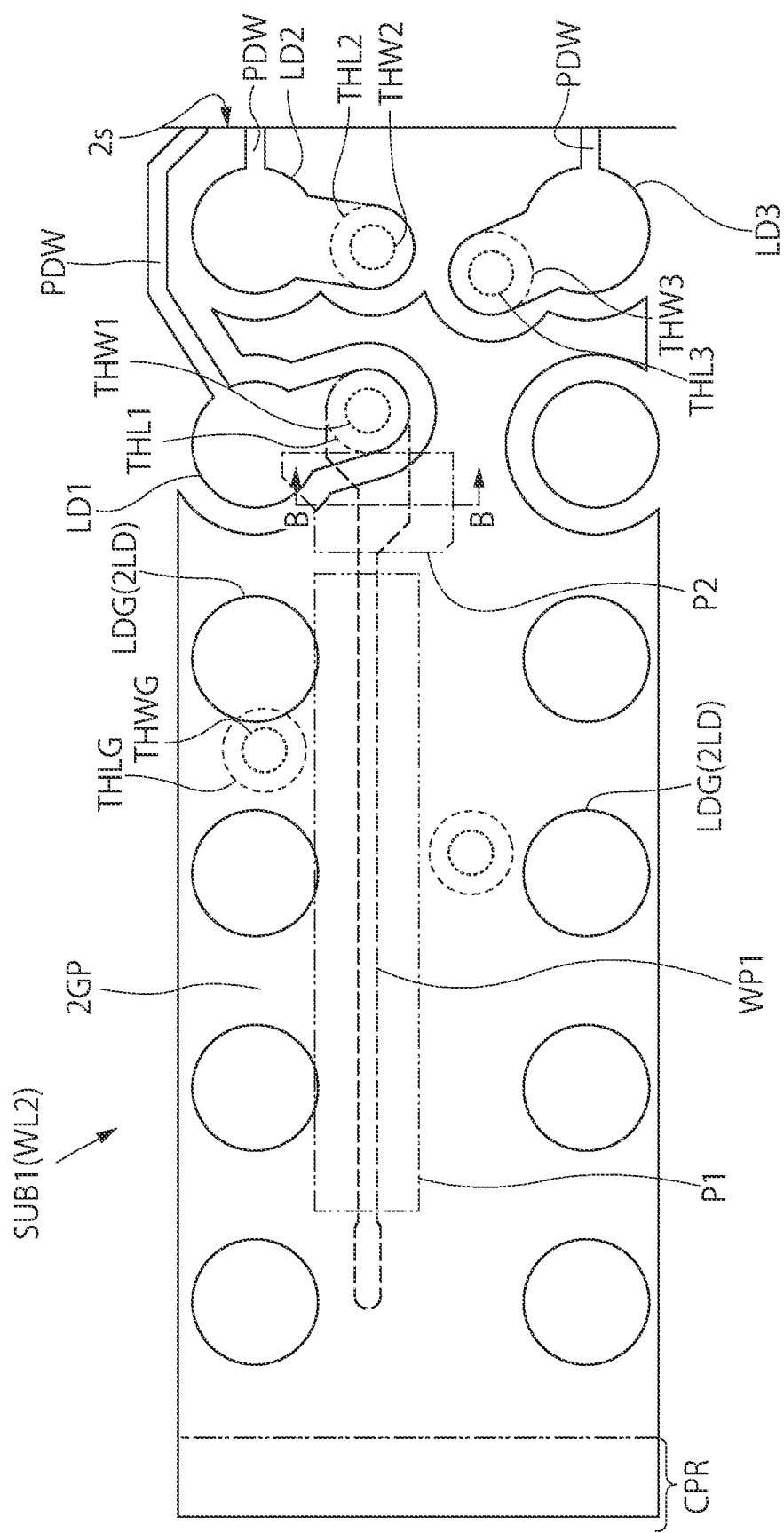
FIG. 14 is an enlarged plan view showing a state where a first wiring pattern, in which a first signal is transmitted, among the plurality of wiring patterns shown in FIG. 8 and the second wiring layer shown in FIG. 10 are overlapped.
Figure 15:
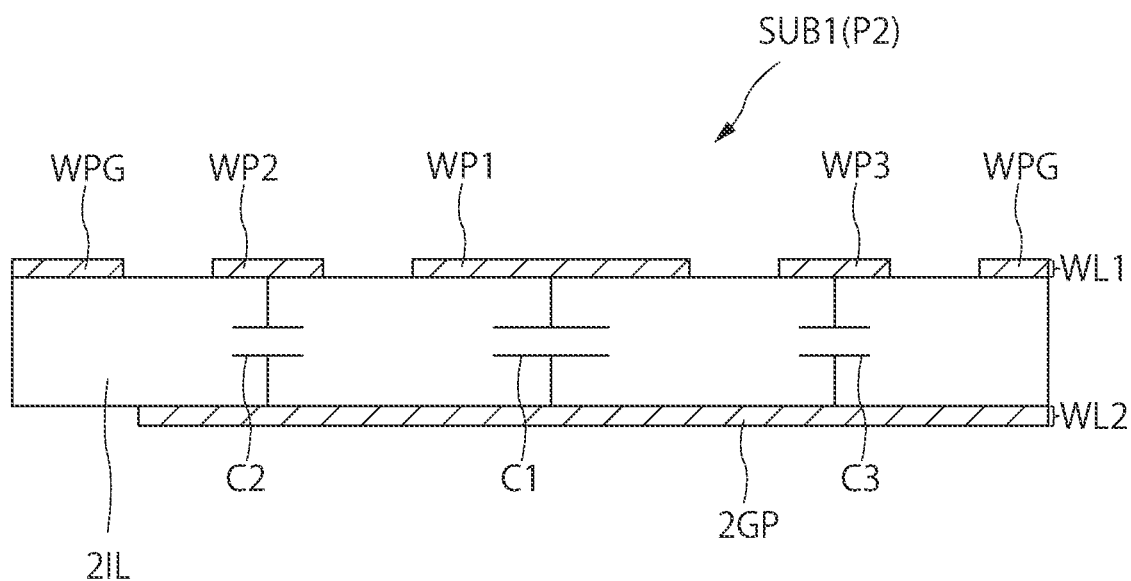
FIG. 15 is an enlarged cross-sectional view along a line B-B in FIG. 14.

In the above, an example of giving capacitance to the signal transmission path by arranging the ground pattern around the wiring pattern constituting the signal transmission path in a plan view has been described. Hereinafter, a mode of giving capacitance to the wiring pattern constituting the signal transmission path in a thickness direction of the wiring substrate will be described. FIG. 14 is an enlarged plan view showing a state where a first wiring pattern, in which a first signal is transmitted, among the plurality of wiring patterns shown in FIG. 8 and the second wiring layer shown in FIG. 10 are overlapped. FIG. 15 is an enlarged cross-sectional view along a line B-B in FIG. 14. In the following, an example of a method of giving capacitance in the thickness direction of the wiring substrate will be shown while taking the wiring substrate SUB1 shown in FIG. 8 as a representative. However, as a modification, the combination with the wiring substrate SUB2 shown in FIG. 11 or the wiring substrate SUB3 shown in FIG. 12 is also possible.

The wiring layer WL2 shown in FIG. 10 includes the land LD1 which is an external terminal electrically connected to the wiring pattern WP1 (see FIG. 8), the land LD2 which is an external terminal electrically connected to the wiring pattern WP2 (see FIG. 8), land LD3 which is an external terminal electrically connected to the wiring pattern WP3 (see FIG. 8), and the ground pattern 2GP electrically connected to the ground wiring pattern WPG. As shown in FIG. 14, the wiring pattern WP1 of the portion P2 of the wiring pattern group GWPS overlaps with the ground pattern 2GP of the wiring layer WL2 in a plan view.

As shown in FIG. 15, in the portion P2 in which a wiring width of the wiring pattern WP1 is large, each of the wiring patterns WP2, and WP3 overlaps with the ground pattern 2GP. Therefore, a capacitance C1 is formed between the wiring pattern WP1 and the ground pattern 2GP, a capacitance C2 formed between the wiring pattern WP2 and the ground pattern 2GP, and a capacitance C3 is formed between the wiring pattern WP3 and the ground pattern 2GP. The value of the capacitance formed between each of the wiring patterns WP1, WP2, and WP3 and the ground pattern 2GP increases in proportion to the area of the patterns facing each other. Therefore, in the case of the example shown in FIG. 15, the value of the capacitance C1 is larger than the value of the capacitance C2 and the value of the capacitance C3. As described above, in the signal transmission path including the wiring pattern WP1, it is necessary to reduce the characteristic impedance in particular, and the characteristic impedance of the signal transmission path including the wiring pattern WP1 can be reduced by giving the capacitance C1 larger than other capacitances to the wiring pattern WP1 as shown in FIG. 15.

Figure 16:
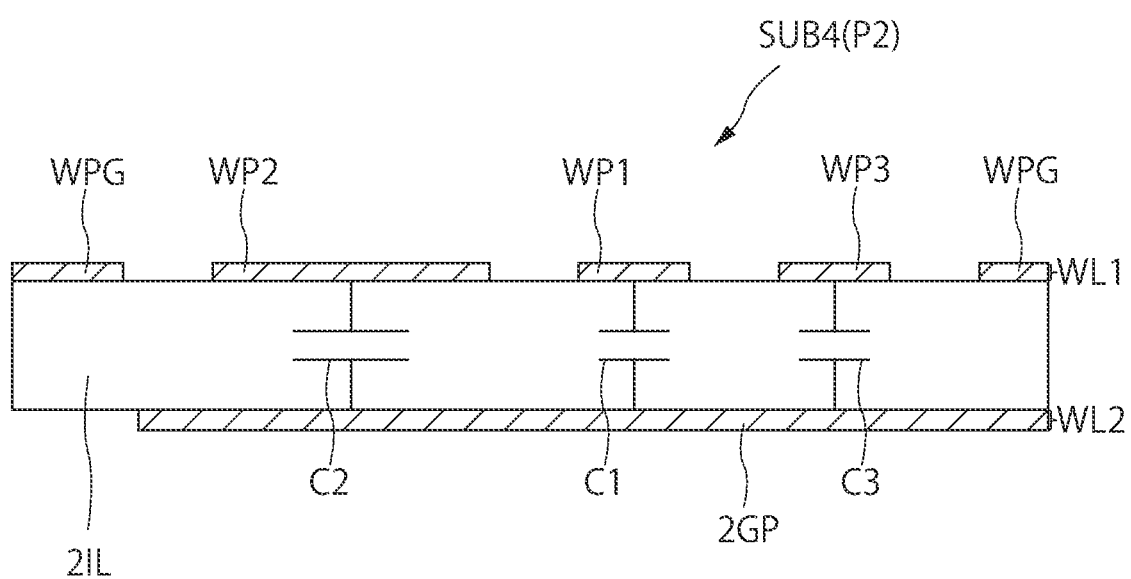
FIG. 16 is an enlarged cross-sectional view showing a modification with respect to FIG. 15.

By the way, as described with reference to FIG. 15, the technique for reducing the characteristic impedance of the wiring path by the capacitance coupling to the wiring pattern included in the signal transmission path in the thickness direction of the wiring substrate can be applied not only to the wiring pattern WP1 but also to the wiring pattern WP2 and the wiring pattern WP3. FIG. 16 is an enlarged cross-sectional view showing a modification with respect to FIG. 15.

A wiring substrate SUB4 shown in FIG. 16 is different from the wiring substrate SUB1 shown in FIG. 15 in that the wiring width of the wiring pattern WP2 is larger than the wiring widths of the other wiring patterns WP1 and WP3 in the portion P2, In the case of the example shown in FIG. 16, the value of the capacitance C2 formed in the wiring pattern WP2 is larger than the value of the capacitance C1 and the value of the capacitance C3. In this case, the effect of reducing the characteristic impedance of the signal transmission path including the wiring pattern WP2 can be obtained.

Although not shown, there is the case where the wiring width of the wiring pattern WP3 is larger than the wiring widths of the other wiring patterns WP1 and WP2. Alternatively, there is the case where any of the two or more wiring patterns of the wiring pattern. WP1, the wiring pattern WP2, and the wiring pattern WP3 has the wiring width larger than that of the other wiring pattern. In this case, the effect of reducing the characteristic impedance of the signal transmission path including the wiring pattern having the large wiring width can be obtained.

When a semiconductor device including the wiring substrate SUB4 described with reference to FIG. 16 and a semiconductor device including a modification (not shown) are extracted as technical ideas, they can be described as follows. Since the wiring substrate SUB4 is the same as the wiring substrate SUB1 shown in FIG. 15 except for the above-mentioned differences, the description will be given below with reference to the drawings used in the description of the semiconductor device PKG1 shown in FIG. 5.

That is, the semiconductor device PKG1 (see FIG. 5) includes the semiconductor chip CHP1 (FIG. 5), the wiring substrate SUB4 having the upper surface 2t (see FIG. 5) on which the semiconductor chip CHP1 is mounted (see FIG. 5) and the lower surface 2b (see FIG. 5) opposite the upper surface 2t, and the bonding wire BW (see FIG. 5) electrically connected to each of the semiconductor chip CHP1 and the wiring substrate SUB4.

The wiring substrate SUB4 includes the wiring layer WL1 which is arranged on the side of the upper surface 2t and in which the bonding pad 2PD (see FIG. 5) to which the bonding wire BW is connected is formed and the wiring layer WL2 which is arranged opposite the wiring layer WL1 via the insulating layer 2IL and in which the external terminal is formed.

The wiring layer WL1 includes, in addition to the bonding pad 2PD, the wiring pattern WP1 which is a transmission path of the signal SG1 (see FIG. 2), the wiring pattern WP2 which is a transmission path of the signal SG2 (see FIG. 2) different from the signal SG1 and is arranged next to one side of the wiring pattern WP1, and the wiring pattern WP3 which is a transmission path of the signal SG3 (see FIG. 2) different from the signal SG1 and the signal SG2 and is arranged next to the other side of the wiring pattern WP1. Also, the wiring layer WL1 further includes the two ground wiring patterns WPG which are a transmission path of the reference potential VSS (see FIG. 2) and are extended along the wiring pattern WP2 or the wiring pattern WP3 so as to arrange each of the wiring pattern WP1, the wiring pattern WP2, and the wiring pattern WP3 therebetween.

The wiring layer WL2 includes the land LD1 which is an external terminal electrically connected to the wiring pattern WP1, the land LD2 which is an external terminal electrically connected to the wiring pattern WP2, the land LD3 which is an external terminal electrically connected to the wiring pattern WP3, and the ground pattern 2GP which is electrically connected to the ground wiring pattern WPG.

The wiring pattern group GWPS including the wiring pattern WP1, the wiring pattern WP2, and the wiring pattern WP3 has the portion P1 (see FIG. 8) in which the wiring widths of the wiring pattern WP1, the wiring pattern WP2, and the wiring pattern WP3 are equal to each other and the portion P2 in which any of the wiring pattern of the wiring pattern WP1, the wiring pattern WP2, and the wiring patter WP3 has the wiring width larger than those of the other wiring patterns. In a plan view, in the portion P2 of the wiring pattern group, the wiring pattern having a large wiring width overlaps with the ground pattern 2GP of the wiring layer WL2.

Modification 3

Various modifications have been described above, and the modifications described above may be applied in combination.

In the foregoing, the invention made by the inventors of the present invention has been concretely described based on the embodiments. However, it is needless to say that the present invention is not limited to the foregoing embodiments and various modifications and alterations can be made within the scope not departing from the gist of the present invention.

For example, in the above embodiment, the case where a plurality of solder balls SB is arranged in a matrix shape as shown in FIG. 4 has been described, but the plurality of solder balls SB may be arranged in a peripheral shape along each side of the mounting surface (lower surface 2b) of the wiring substrate SUB1.

Further, in the above embodiment, the case where the type of signal transmitted to the signal transmission path SGP is, for example, a data signal has been described, but a part of the signal transmitted to this signal transmission path SGP may be a command/address signal. In this case, the transmission speed of the command/address signal is about half that of the data signal (that is, 800 Mbps).

What is claimed is:
1. A semiconductor device comprising:
   a semiconductor chip;
   a wiring substrate having a first surface on which the semiconductor chip is mounted and a second surface opposite the first surface; and
   a plurality of bonding wires electrically connected the semiconductor chip with the wiring substrate,
   wherein the wiring substrate includes:
      a first wiring layer in which a plurality of bonding pads is formed, the plurality of bonding wires being connected with the plurality of bonding pads, respectively;
      a second wiring layer in which a plurality of external terminals is formed; and
      an insulating layer arranged between the first wiring layer and the second wiring layer,
   wherein the first wiring layer further includes:
      a first wiring pattern which is a transmission path of a first signal;
      a second wiring pattern which is a transmission path of a second signal different from the first signal and which is arranged next to one side of the first wiring pattern;
      a third wiring pattern which is a transmission path of a third signal different from each of the first signal and the second signal and which is arranged next to the other side of the first wiring pattern; and
      two ground wiring patterns which are a transmission path of a reference potential and which are extended along one of the second wiring pattern and the third wiring pattern so as to arrange the first wiring pattern, the second wiring pattern and the third wiring pattern therebetween, and
   wherein a wiring pattern group including the first wiring pattern, the second wiring pattern, and the third wiring pattern has:
      a first portion in which a wiring width of the first wiring pattern, a wiring width of the second wiring pattern and a wiring width of the third wiring pattern are equal to each other; and
      a second portion in which the wiring width of the first wiring pattern is larger than the wiring width of the second wiring pattern and the wiring width of the third wiring pattern.

2. The semiconductor device according to claim 1,
wherein the wiring substrate further includes a first through hole wiring penetrating the insulating layer,
wherein the first wiring layer further includes:
   a first bonding pad which is electrically connected to the first wiring pattern and to which a first bonding wire of the plurality of bonding wires is bonded; and
   a first through hole land to which each of the first wiring pattern and the first through hole wiring is bonded,
wherein the first wiring pattern includes:
   a signal transmission wiring portion between the first bonding pad and the first through hole land; and
   a power feeding wiring portion extending from the first through hole land to an outer edge of the wiring substrate, and
wherein the second portion of the wiring pattern group exists in the signal transmission wiring portion of the first wiring pattern.

3. The semiconductor device according to claim 2,
wherein a wiring width of the power feeding wiring portion of the first wiring pattern is smaller than a wiring width of the first wiring pattern in the first wiring portion of the wiring pattern group.

4. The semiconductor device according to claim 1,
wherein the wiring substrate further includes a first through hole wiring penetrating the insulating layer,
wherein the first wiring layer further includes:
   a first bonding pad which is electrically connected to the first wiring pattern and to which a first bonding wire of the plurality of bonding wires is bonded; and
   a first through hole land to which the first wiring pattern and the first through hole wiring are bonded, and
wherein a ground pattern electrically connected to the ground wiring pattern is arranged around the first through hole land of the first wiring layer so as to be adjacent to the first through hole land.

5. The semiconductor device according to claim 1,
wherein the first wiring layer further includes a fourth wiring pattern which is a transmission path of a fourth signal different from each of the first signal, the second signal, and the third signal and which is arranged next to one of the two ground wiring patterns,
wherein the plurality of bonding wires includes
   a first bonding wire electrically connected to the first wiring pattern;
   a second bonding wire electrically connected to the second wiring pattern;
   a third bonding wire electrically connected to the third wiring pattern;
   a fourth bonding wire electrically connected to the fourth wiring pattern; and
   two ground bonding wires electrically connected to the two ground wiring patterns, respectively, and
wherein each of the first bonding wire, the second bonding wire, the third bonding wire, and the fourth bonding wire is arranged so as to be adjacent to each other between the two ground bonding wires.

6. The semiconductor device according to claim 1,
wherein the plurality of external terminals includes:
   a first land electrically connected to the first wiring pattern;
   a second land electrically connected to the second wiring pattern;
   a third land electrically connected to the third wiring pattern; and
   a ground pattern electrically connected to the ground wiring pattern, and
wherein the first wiring pattern of the second portion of the wiring pattern group overlaps with the ground pattern of the second wiring layer in a plan view.

7. The semiconductor device according to claim 1,
wherein wiring layers provided in the wiring substrate are only the first wiring layer and the second wiring layer.

8. The semiconductor device according to claim 1,
wherein the first signal is a data signal transmitted at a transmission speed of 1.6 Gbps or more.

9. A semiconductor device comprising:
a semiconductor chip;
a wiring substrate having a first surface on which the semiconductor chip is mounted and a second surface opposite the first surface; and
a plurality of bonding wires each electrically connecting the semiconductor chip and the wiring substrate,
wherein the wiring substrate includes:
   a first wiring layer in which a plurality of bonding pads is formed, the plurality of bonding wires being connected with the plurality of bonding pads, respectively;
   a second wiring layer in which a plurality of external terminals is formed; and
   an insulating layer arranged between the first wiring layer and the second wiring layer,
wherein the first wiring layer further includes:
   a first wiring pattern which is a transmission path of a first signal;
   a second wiring pattern which is a transmission path of a second signal different from the first signal and which is arranged next to one side of the first wiring pattern;
   a third wiring pattern which is a transmission path of a third signal different from each of the first signal and the second signal and which is arranged next to the other side of the first wiring pattern; and
   two ground wiring patterns which are a transmission path of a reference potential and which are extended along one of the second wiring pattern and the third wiring pattern so as to arrange the first wiring pattern, the second wiring pattern and the third wiring pattern therebetween,
wherein the second wiring layer includes:
   a first land which is an external terminal electrically connected to the first wiring pattern;
   a second land which is an external terminal electrically connected to the second wiring pattern;
   a third land which is an external terminal electrically connected to the third wiring pattern; and
   a ground pattern electrically connected to the ground wiring pattern,
wherein a wiring pattern group including the first wiring pattern, the second wiring pattern, and the third wiring pattern includes:
   a first portion in which a wiring width of the first wiring pattern, a wiring width of the second wiring pattern and a wiring width of the third wiring pattern are equal to each other; and
   a second portion formed in any one of the first wiring pattern, the second wiring pattern and the third wiring pattern and having a wiring width larger than the wiring width of the first portion, and
wherein the one in the second portion overlaps with the ground pattern of the second wiring layer.

10. The semiconductor device according to claim 9, wherein wiring layers provided in the wiring substrate are only the first wiring layer and the second wiring layer.

11. The semiconductor device according to claim 9, wherein any of the first signal, the second signal, and the third signal is a data signal transmitted at a transmission speed of 1.6 Gbps or more.

\* \* \* \* \*